United States Patent
Shi et al.

(10) Patent No.: US 11,950,454 B2
(45) Date of Patent: Apr. 2, 2024

(54) DISPLAY PANEL AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Ling Shi, Beijing (CN); Hao Zhang, Beijing (CN); Yipeng Chen, Beijing (CN); Wenqiang Li, Beijing (CN); Chienpang Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 471 days.

(21) Appl. No.: 17/279,675

(22) PCT Filed: May 11, 2020

(86) PCT No.: PCT/CN2020/089590
§ 371 (c)(1),
(2) Date: Mar. 25, 2021

(87) PCT Pub. No.: WO2021/226785
PCT Pub. Date: Nov. 18, 2021

(65) Prior Publication Data
US 2022/0115453 A1 Apr. 14, 2022

(51) Int. Cl.
*H10K 59/121* (2023.01)
*H10K 50/844* (2023.01)
(Continued)

(52) U.S. Cl.
CPC ......... *H10K 59/121* (2023.02); *H10K 50/844* (2023.02); *H10K 59/131* (2023.02); *H10K 59/65* (2023.02)

(58) Field of Classification Search
CPC .................. H10K 50/80; H10K 59/131; G06F 2203/04111; G02F 1/136286
See application file for complete search history.

(56) References Cited

U.S. PATENT DOCUMENTS 10,490,620 B1 * 11/2019 Lai .................... G02F 1/136286
2017/0154566 A1 * 6/2017 Ryoo .................. G09G 3/3648
(Continued)

FOREIGN PATENT DOCUMENTS

| CN | 109767689 A | | 5/2019 | |
| CN | 110208994 A | * | 9/2019 | ....... G02F 1/133514 |
| CN | 112419901 A | * | 2/2021 | |

OTHER PUBLICATIONS

Extended (Supplementary)European Search Report dated May 4, 2023, issued in counterpart EP Application No. 20904262.1. (18 pages).

*Primary Examiner* — Alia Sabur
(74) *Attorney, Agent, or Firm* — WHDA, LLP

(57) ABSTRACT

A display panel and a display device are disclosed, the display panel comprises: a base substrate; and pixel circuits in an array, the display panel comprises a light transmittance region and a display region around the light transmittance region, the pixel circuits are disposed in the display region, a gate line of each row of m rows of pixel circuits is divided into a first gate line portion and a second gate line portion which are connected through an auxiliary gate line, a data line of each column of n columns of pixel circuits is divided into a first data line portion and a second data line portion which are connected through an auxiliary data line.

19 Claims, 12 Drawing Sheets

(51) Int. Cl.
*H10K 59/131* (2023.01)
*H10K 59/65* (2023.01)

(56) References Cited

U.S. PATENT DOCUMENTS

| | | |
|---|---|---|
| 2017/0162637 A1* | 6/2017 | Choi ........................ G09G 3/20 |
| 2019/0051670 A1* | 2/2019 | Bei ........................ H01L 27/124 |
| 2019/0123066 A1* | 4/2019 | Zhan ...................... H01L 27/124 |
| 2019/0214595 A1* | 7/2019 | Park ........................ H10K 59/40 |
| 2019/0319212 A1 | 10/2019 | Park et al. |
| 2020/0044006 A1* | 2/2020 | Lee ........................ H10K 50/841 |
| 2020/0098843 A1 | 3/2020 | Jeon et al. |
| 2020/0110495 A1 | 4/2020 | Han et al. |
| 2020/0110525 A1 | 4/2020 | Park et al. |
| 2020/0176542 A1* | 6/2020 | Park ........................ H10K 77/10 |

* cited by examiner

DISPLAY PANEL AND DISPLAY DEVICE

CROSS-REFERENCE TO RELATED APPLICATION

This application is a National Stage Application of International Application No. PCT/CN2020/085590 filed on May 11, 2020, the whole disclosure of which is incorporated herein by reference.

TECHNICAL FIELD

The present disclosure relates to the field of display technology, especially to a display panel and a display device.

BACKGROUND

With the progress of display technology, Organic Light Emitting Diode (OLED) display devices are one of the hot spots in the field of tablet display device research, the OLED display device has advantages of bright colors, good viewing angles, high contrast, bendable, fast response speed, low power consumption, etc. thereby being under focus. The OLED display device has a broader application prospect in the field of future display, and it has a broad application space in multiple fields such as mobile display, vehicle display, medical display, etc.

For the display device with a camera function, such as a mobile terminal, etc., the requirement of high screen-to-body ratio is increasing, in recent years, the development of full screens with ultra-high screen-to body ratios has been rapid, however, it remains an urgent problem to be solved in the field that how to make a mobile terminal with an ultra-high screen-to-body ratio of the full screen while the front camera function is kept. Under-screen camera technology is a good solution to realize the full screen.

SUMMARY

Some embodiments of the present disclosure provide a display panel, comprising: a base substrate; and pixel circuits arranged in an array on the base substrate, wherein each row of pixel circuits comprises a gate line extending in a row direction, each column of pixel circuits comprises a data line extending in a column direction, the gate line and the data line are disposed on different layers, wherein the display panel comprises a light transmittance region and a display region around the light transmittance region, pixel circuits are disposed in the display region, the gate line of each row of the m rows of pixel circuits is divided into a first gate line portion and a second gate line portion by the light transmittance region, the first gate line portion is connected to the second gate line portion by an auxiliary gate line, at least part of the auxiliary gate line extends along an edge of the light transmittance region, wherein m is a natural number and m≥2, wherein the data line of each column of the n columns of pixel circuits is divided into a first data line portion and a second data line portion by the light transmittance region, the first data line portion is connected to the second data line portion by an auxiliary data line, wherein n is a natural number and n≥2, wherein the auxiliary gate line comprises an auxiliary gate line sub-portion, the auxiliary gate line sub-portion and the auxiliary data line have an overlapped region, wherein the m rows of pixel circuits comprise at least two rows of pixel circuits, an overlapped area of the auxiliary gate line sub-portion of the auxiliary gate line for connecting the first gate line portion and the second gate line portion in one of the at least two rows of pixel circuits and the auxiliary data line is different from an overlapped area of the auxiliary gate line sub-portion of the auxiliary gate line for connecting the first gate line portion and the second gate line portion in the other one of the at least two rows of pixel circuits and the auxiliary data line.

In some embodiments, the auxiliary gate line sub-portion is located on a side of the light transmittance region close to the first gate line portion, and the auxiliary gate line sub-portion extends in the row direction.

In some embodiments, a number of the auxiliary data line overlapping the auxiliary gate line sub-portion of the auxiliary gate line for connecting the first gate line portion and the second gate line portion in one of the at least two rows of pixel circuits is different from a number of the auxiliary data line overlapping the auxiliary gate line sub-portion of the auxiliary gate line for connecting the first gate line portion and the second gate line portion in the other one of the at least two rows of pixel circuits.

In some embodiments, the light transmittance region has a first axis parallel to the row direction, a first group rows of the m rows of pixel circuits are located on one side of the first axis, a second group rows of pixel circuits are located on the other side of the first axis, auxiliary gate lines for connecting the first gate line portions and the second gate line portions in the first group rows of pixel circuits are all located on one side of the first axis, and auxiliary gate lines for connecting first gate line portions and second gate line portions in the second group rows of pixel circuits are located on the other side of the first axis.

In some embodiments, the auxiliary gate line and the data line are disposed in the same layer, at least part of the auxiliary data line extends along the edge of the light transmittance region, the auxiliary data line for connecting the first data line portion and the second data line portion of each column of at least part of the n columns of pixel circuits and the gate line are disposed in the same layer.

In some embodiments, each row of pixel circuits further comprises a reset signal line extending in the row direction, the reset signal line and the gate line are disposed in the same layer and parallel to each other, the reset signal line of each row of them rows of pixel circuits is divided into a first reset signal line portion and a second reset signal line portion by the light transmittance region, in the m rows of pixel circuits, the first reset signal line portion of the $i_{th}$ row of pixel circuits is electrically connected to the first gate line portion of the $i-1_{th}$ row of pixel circuits, the second reset signal line portion of the $i_{th}$ row of pixel circuits is electrically connected to the second gate line portion of the $i-1_{th}$ row of pixel circuits, wherein i is a natural number, and $1<i\leq m$.

In some embodiments, an end portion of the first reset signal line of the $i_{th}$ row of pixel circuits close to the light transmittance region is electrically connected to an end portion of first gate line portion of the $i-1_{th}$ row of pixel circuits close to the light transmittance region by a first portion of the auxiliary gate line for connecting the first gate line portion and the second gate line portion of the $i-1_{th}$ row of pixel circuits, and an end portion of the second reset signal line of the $i_{th}$ row of pixel circuits close to the light transmittance region is electrically connected to an end portion of second gate line portion of the $i-1_{th}$ row of pixel circuits close to the light transmittance region by a second portion of the auxiliary gate line for connecting the first gate line portion and the second gate line portion of the $i-1_{th}$ row of pixel circuits.

In some embodiments, each row of pixel circuits further comprises an initialization signal line extending in the row direction, the initialization signal line is located on different layers with the gate line and the data line, the initialization signal line of each row of the m rows of pixel circuits is divided into a first initialization signal line portion and a second initialization signal line portion by the light transmittance region, first initialization signal line portions and second initialization signal line portions of at least two rows of the m rows of pixel circuits are connected to an auxiliary initialization signal line, the auxiliary initialization signal line and the initialization signal line are disposed in the same layer, and are disposed around the light transmittance region.

In some embodiments, at least part of the auxiliary data line extends along the edge of the light transmittance region, the auxiliary data line for connecting the first data line portion and the second data line portion of each column of at least part of the n columns of pixel circuits and the initialization signal line are disposed in the same layer.

In some embodiments, the first data line portion of each column of odd-numbered columns of the n columns of pixel circuits is connected to the second data line portion of the same column of pixel circuits by the first auxiliary data line, the first data line portion of each column of even-numbered columns of the n columns of pixel circuits is connected to the second data line portion of the same column of pixel circuits by the second auxiliary data line, the first auxiliary data line is disposed in the same layer with one of the gate line and the initialization signal line, the second auxiliary data line is disposed in the same layer with the other one of the gate line and the initialization signal line, at least part of the first auxiliary data line extends along the edge of the light transmittance region, and at least part of the second auxiliary data line extends along the edge of the light transmittance region.

In some embodiments, the light transmittance region has a second axis parallel to the column direction, a first group columns of the n columns of pixel circuits are located on one side of the second axis, a second group columns of pixel circuits are located on the other side of the second axis, first auxiliary data lines and second auxiliary data lines for connecting the first gate line portions and the second gate line portions in the first group columns of pixel circuits are all located on one side of the second axis, and the first auxiliary data lines and the second auxiliary data lines for connecting the first gate line portions and the second gate line portions in the second group columns of pixel circuits are located on the other side of the second axis.

In some embodiments, an orthographic projection of the auxiliary initialization signal line on the base substrate surrounds orthographic projections of the first auxiliary data line and the second auxiliary data line on the base substrate.

In some embodiments, the auxiliary initialization signal line is a closed loop.

In some embodiments, each row of pixel circuits further comprises a light emitting control line extending in the row direction, the light emitting control line and the gate line are disposed in the same layer and parallel to each other, the light emitting control line of each row of the m rows of pixel circuits is divided into a first light emitting control line portion and a second light emitting control line portion by the light transmittance region, end portions of the first light emitting control line portion and the second light emitting control line portion close to the light transmittance region are suspended.

In some embodiments, each column of pixel circuits further comprises a power signal line extending in the column direction, the power signal line and the data line are disposed in the same layer and parallel to each other, the power signal line of each column of the n columns of pixel circuits is divided into a first power signal line portion and a second power signal line portion by the light transmittance region, end portions of the first power signal line portion and the second power signal line portion are suspended close to the light transmittance region.

In some embodiments, the display panel has a wiring region, the wiring region is located between the light transmittance region and the display region, the wiring region surrounds the light transmittance region, and is surrounded by the display region, the auxiliary gate line is located in the wiring region.

In some embodiments, the display panel comprises a first gate layer, a second gate insulating layer, a second gate layer, an interlayer dielectric layer and a source/drain layer away from the base substrate in sequence, the gate line is located on the first gate layer, the data line and the auxiliary gate line are located on the source/drain layer, an end portion of the first gate line portion close to the light transmittance region is electrically connected to a first end portion of the auxiliary gate line through a first via hole, an end portion of the second gate line portion close to the light transmittance region is electrically connected to a second end portion of the auxiliary gate line through a second via hole, the first via hole and the second via hole run through the second gate insulating layer, the interlayer dielectric layer between the first gate layer and the source/drain layer.

In some embodiments, the display panel further comprises a cathode layer on the base substrate, and an encapsulating layer on one side of the cathode layer away from the base substrate, the encapsulating layer comprises a first inorganic encapsulating layer, an organic encapsulating layer and a second inorganic encapsulating layer away from the base substrate in sequence.

In some embodiments, the light transmittance region comprises a light-transmitting blind hole or a light-transmitting through hole.

Some embodiments of the present disclosure provide a display device, comprising: the display panel according to the above embodiments, an image acquisition device, being located on one side of the display panel away from the display surface.

BRIEF DESCRIPTION OF THE DRAWINGS

Other features, purposes and advantages of the present disclosure would become more apparent by the following detailed description to the non-limited embodiments below with reference to the drawings, wherein.

DETAILED DESCRIPTION OF EMBODIMENTS

Figure 1:
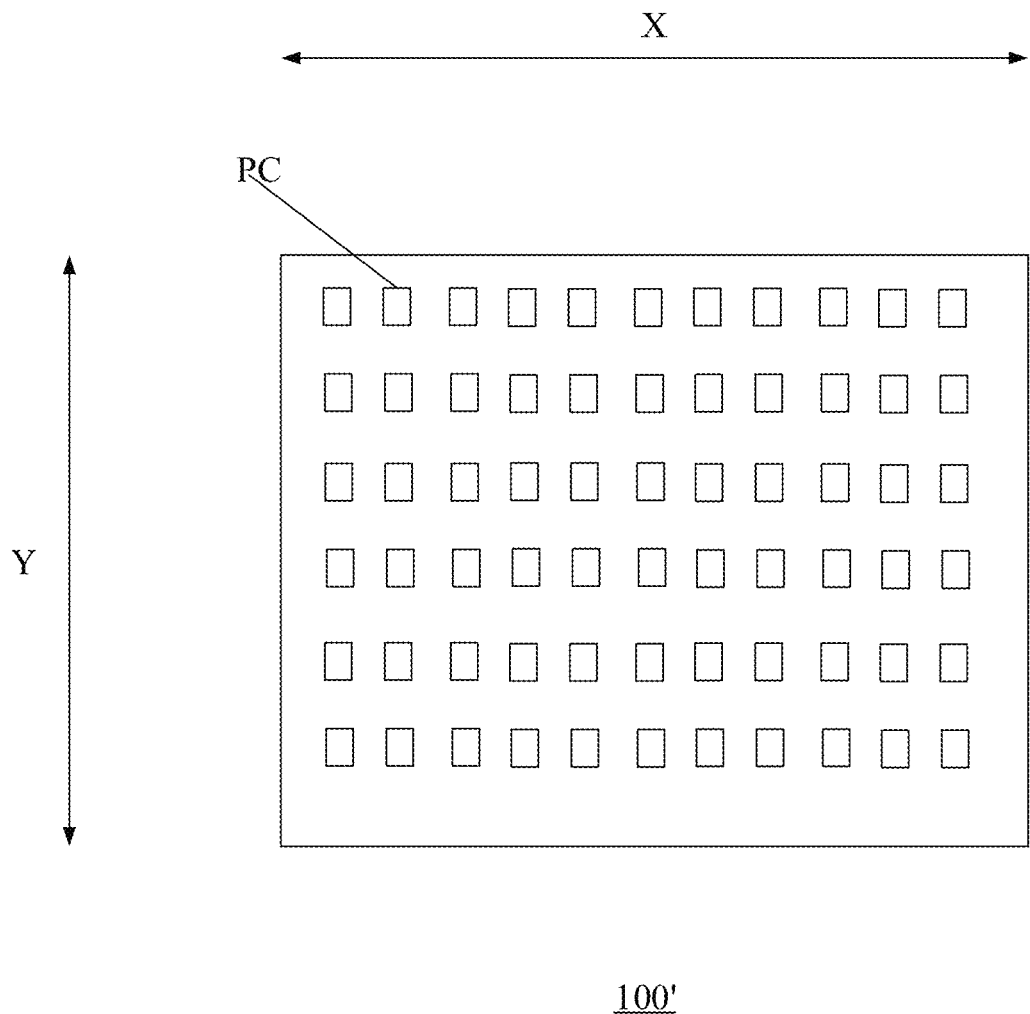
FIG. 1 is a schematic plan view of an OLED display panel in the related art.

The present disclosure will be further described in detail below with reference to the drawings and embodiments. It can be understood that specific embodiments described here are only used to explain the present disclosure, but not to limit the present disclosure. In addition, it should be noted that, for ease of description, only parts related to the present disclosure are shown in the drawings.

It should be noted that the embodiments in the present disclosure and features in the embodiments can be combined with each other if there is no conflict.

In addition, in the following detailed description, for ease of explanation, many specific details are set forth to provide a comprehensive understanding of the embodiments of the present disclosure. Obviously, however, one or more embodiments can also be implemented without these specific details.

It should be understood that, although the terms first, second, etc. may be used herein to describe different elements, these elements should not be limited by these terms. These terms are only used to distinguish one element from another. For example, without departing from the scope of exemplary embodiments, the first element may be named as the second element, and similarly, the second element may be named as the first element. The term "and/or" as used herein includes any and all combinations of one or more of the related listed items.

It should be understood that when an element or layer is referred to as being "formed on" another element or layer, the element or layer can be directly or indirectly formed on the other element or layer. That is, for example, there may be an intermediate element or an intermediate layer. In contrast, when the element or layer is referred to as being "directly formed on" another element or layer, there is no intermediate element or layer. Other terms used to describe the relationship between elements or layers should be interpreted in a similar manner (for example, "between" and "directly between", "adjacent" and "directly adjacent", etc.).

The terms used herein are only for the purpose of describing specific embodiments, and are not intended to limit the embodiments. As used herein, unless otherwise indicated clearly in the context, a singular form is also intended to include the plural form. It will also be understood that when terms "comprising" and/or "including" are used herein, it means that the described features, wholes, steps, operations, elements and/or components are present, but the presence or addition of one or more other features, wholes, steps, operations, elements, components, and/or combinations thereof are not excluded.

In the present disclosure, unless otherwise specified, the expressions "located in the same layer" and "disposed in the same layer" generally mean that the first component and the second component can use the same material and can be formed by the same patterning process. The expressions "located on different layers" and "disposed on different layers" generally indicate that the first component and the second component are formed by different patterning processes.

In the related art, the under-screen camera technology refers to the disposition of an image acquisition device, such as a camera, etc. on an opposite side of a display surface of a display panel, it is usually necessary to reserve a predetermined region on the display panel in which physical through hole is established or a light transmittance region is formed, so that external light can be captured by the image acquisition device through the physical through hole or the light transmittance region in the display panel, thereby realizing imaging. The above-mentioned physical through hole or light transmittance region usually has a small size, for example, when the physical through hole or light transmittance region is circular, a diameter of the physical through hole or the light transmittance region is, for example, 4 mm or less, thereby realizing the camera function of the display device while increasing the screen-to-body ratio.

For the solution using the light transmittance region, there are many layers in the manufacturing process of the display panel, to realize the normal operation of the image acquisition device on the opposite side of the display surface of the display panel, there is a certain requirement to the transmittance ratio of the light transmittance region of the display panel. Because the metal film layer strongly reflects light, it may have a greater negative influence on the imaging effect of the image acquisition device, therefore the metal wiring manner at and near the light transmittance region of the display panel also has a significant effect on the imaging of the camera.

FIG. 1 is a schematic plan view of the OLED display panel in the related art. As shown in FIG. 1, the OLED display panel 100' comprises a base substrate 10, and a plurality of pixel circuits PC arranged in an array on the base substrate 10, each pixel circuit provides electrical signals for a pixel, such as a red pixel, a blue pixel or a green pixel to realize the display of the OLED display panel. As shown in the drawing, a row direction X and a column direction Y of the array arrangement of pixel circuits are perpendicular to each other.

Figure 2:
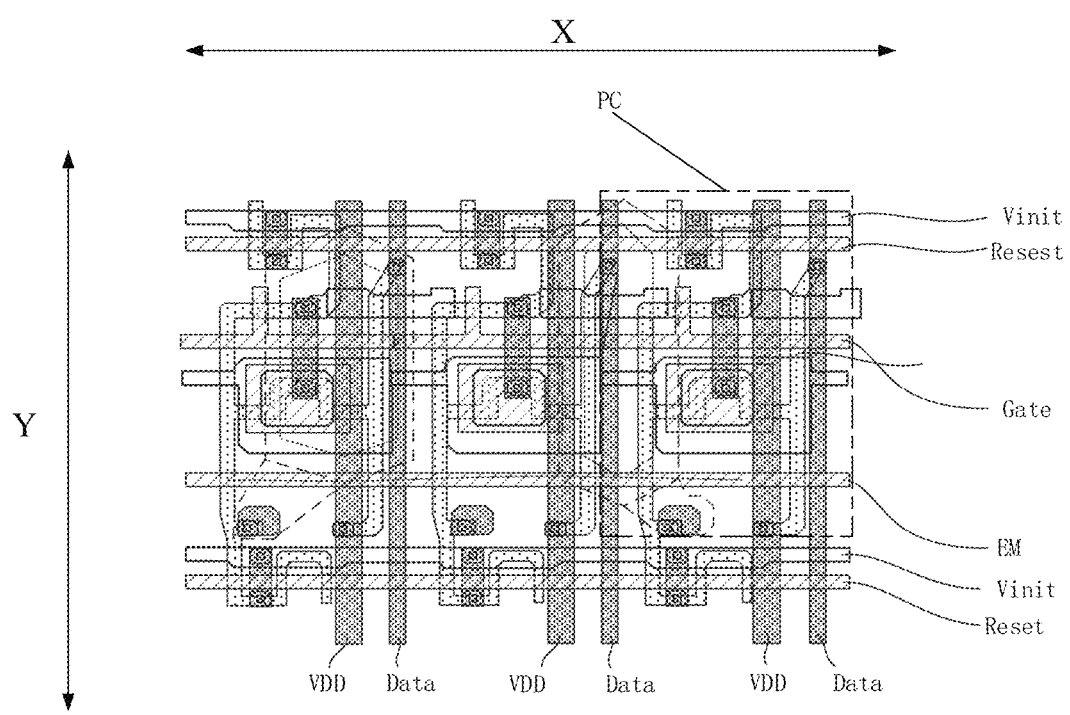
FIG. 2 is a schematic structural view of pixel circuits in FIG. 1.

FIG. 2 is a schematic structural view of pixel circuits in FIG. 1, FIG. 2 illustrates three pixel circuits arranged in one row. Each pixel circuit PC comprises 7 thin film transistors and 1 capacitor; the display panel further comprises initialization signal lines (Vinit), gate lines (Gate), light emitting control lines (EM), reset signal lines (Reset), data lines (Data) and power signal lines (VDD), each of which is electrically connected to each pixel circuit PC for providing electrical signals to each pixel circuit.

Specifically, the plurality of pixel circuits are arranged in an array, and the plurality of pixel circuits can be divided into multiple rows of pixel circuits (as shown in FIG. 2, each row of pixel circuits extends along the row direction X) and multiple columns of pixel circuits (as shown in FIG. 2, each column of pixel circuits extends along the column direction Y), and initialization signal line patterns corresponding to pixel circuits in the same row are sequentially electrically connected to form an integrated structure, that is, the initialization signal line Vinit of the row of pixel circuits; gate line patterns corresponding to pixel circuits in the same row are electrically connected sequentially to form an integrated structure, that is, the gate line Gate of the row of pixel circuits; light emitting control line patterns corresponding to pixel circuits in the same row are electrically connected sequentially to form an integrated structure, that is, the light emitting control line EM of the row of pixel circuits; reset signal line patterns corresponding to pixel circuits in the same row are electrically connected sequentially to form an integrated structure, that is, the reset signal line Reset of the row of pixel circuits; data line patterns corresponding to pixel circuits in the same column are electrically connected sequentially to form an integrated structure, that is, the data line Data of the column of pixel circuits; power signal line patterns corresponding to pixel circuits in the same column are electrically connected sequentially to form an integrated structure, that is the power signal line VDD of the column of pixel circuits.

Exemplarily, each row of pixel circuits includes a plurality of pixel circuits sequentially arranged in the X direction, the initialization signal line Vinit, the reset signal line Reset, the gate line Gate, and the light emitting control line EM all extend in the X direction, the multiple pixel circuits included in the row of pixel circuits may be respectively coupled to the corresponding initialization signal line Vinit, reset signal line Reset, gate line Gate, and light emitting control line EM, and as shown in FIG. 2, for each row of pixel circuits, in the Y direction, the initialization signal line Vinit, the reset signal line Reset, the gate line Gate, and the light emitting control line EM are sequentially arranged in sequence; each column of pixel circuits includes a plurality of pixel circuits arranged sequentially in the Y direction, data lines Data and power signal lines VDD all extend in the Y direction, and multiple pixel circuits included in each column of pixel circuits may be respectively coupled to the corresponding data line Data and power signal line VDD.

Figure 3:
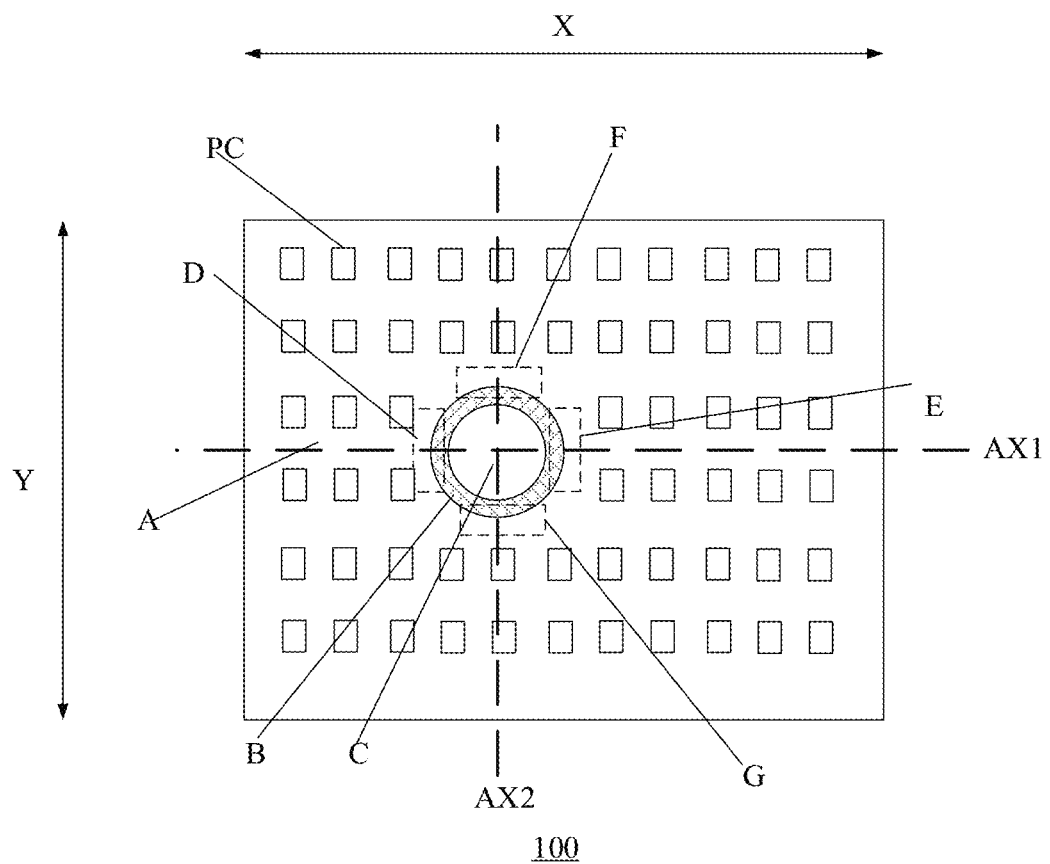
FIG. 3 is a plan view of the OLED display panel according to some embodiments of the present disclosure.

Some embodiments of the present disclosure provide an OLED display panel, FIG. 3 illustrates a schematic plan view of the OLED display panel according to some embodiments of present disclosure. The OLED display panel shown in FIG. 3 and the display panel in the related art as shown in FIG. 1 have approximately the same structure. As shown in FIG. 3, the OLED display panel 100 further comprises a base substrate 10, and a plurality of pixel circuits PC arranged in an array on the base substrate 10, each pixel circuit provides electrical signals for a pixel, such as a red pixel, a blue pixel or a green pixel to realize the display of the OLED display panel. Each pixel is for example, an OLED element, comprising an anode, a light emitting function layer, a cathode arranged away from the base substrate 10. As shown in the drawing, the row direction X and the column direction Y of array arrangement of pixel circuits PC are perpendicular to each other.

The main difference is that: in order to be used in a display device with a camera function and a high screen-to-body ratio, the display panel 100 shown in FIG. 3 is provided with a light transmittance region C and a display region A surrounding the light transmittance region C. The light transmittance region C is used to allow external light to enter the display panel 100 from the display surface of the display panel 100, the external light passes through the light transmittance region C, and is acquired by an image acquisition device, such as a camera on one side of the display panel 100, thereby realizing the imaging function.

The Pixel circuit and its corresponding OLED element are located in the display region A, and there is no pixel circuit and its corresponding OLED element in the light transmittance region C. the anode of the OLED element is usually an opaque metal material, and there may also be a plurality of patterns formed by the opaque metal material in the pixel circuit. The light transmittance region C is mainly used to provide transparent material film layers forming the OLED display panel, therefore, the light transmittance region C can allow as much external light as possible to pass.

In some embodiments, the light transmittance region C is not a physical through hole. Therefore, the OLED display panel in these embodiments does not require a complicated hole-opening process to realize the function of under-screen camera. Compared with the technology of opening physical holes on the OLED panel, the solution of setting the light transmittance region in some embodiments of the present disclosure can occupy a smaller area, further increase the screen-to-body ratio, and enhance the user experience. As shown in FIG. 3, an orthographic projection of the light transmittance region C on the base substrate 10 is circular, with a diameter of, for example, 4 mm. In other embodiments, the orthographic projection of the light transmittance region C on the base substrate 10 can also square, rectangular, rhombus and other shapes. In other embodiments, the light transmittance region C can also be a physical through hole.

Due to the provision of the light transmittance region C, m rows of pixel circuits configured to pass through the position of the light transmittance region C as shown in FIGS. 1 and 2 are divided, and n columns of pixel circuits passing through the position of the light transmittance region C are divided, m, n are natural numbers, and m, n≥2.

Each row of the m rows of pixel circuits is divided into a first pixel row segment and a second pixel row segment, the first pixel row segment is for example located on the left side of the light transmittance region C as shown in FIG. 3, the second pixel row segment is for example located on the right side of the light transmittance region C as shown in FIG. 3.

Each column of the n columns of pixel circuits is divided into a first pixel column segment and a second pixel column segment, the first pixel column segment is for example located on the upper side of the light transmittance region C as shown in FIG. 3, the second pixel column segment is for example located on the lower side of the light transmittance region C as shown in FIG. 3.

For the normal display of the OLED display panel 100, in each row of the m rows of pixel circuits, the initialization signal line Vinit, the reset signal line Reset, the gate line Gate and the light emitting control line EM corresponding to the first pixel row segment respectively need to transmit the same signal with the initialization signal line Vinit, the reset signal line Reset, the gate line Gate and the light emitting control line EM corresponding to the second pixel row segment, for example, the initialization signal line Vinit, the reset signal line Reset, the gate line Gate and the light emitting control line EM corresponding to the first pixel row segment are electrically connected to the initialization signal line Vinit, the reset signal line Reset, the gate line Gate and the light emitting control line EM corresponding to the second pixel row segment, respectively. In each column of the n columns of pixel circuits, the data line Data and the power signal line VDD corresponding to the first pixel column segment respectively transmit the same signal with the data line Data and the power signal line VDD corresponding to the second pixel column segment, for example, the data line Data and the power signal line VDD corresponding to the first pixel column segment are electrically connected to the data line Data and the power signal line VDD corresponding to the second pixel column segment, respectively.

In order to make the light transmittance region C of the OLED display panel 100 has a light transmittance as high as possible, it is necessary to avoid providing patterns of opaque materials in the light transmittance region C. Therefore, as shown in FIG. 3, the OLED display panel 100 further includes a wiring region B, configured to provide auxiliary wirings, and the auxiliary wirings may be electrically connected to the initialization signal line Vinit, the reset signal line Reset, the gate line Gate and the light emitting control line EM corresponding to the aforementioned first pixel row segment and the initialization signal line Vinit, the reset signal line Reset, the gate line Gate and the light emitting control line EM corresponding to the second pixel row segment, respectively, the auxiliary wirings may also be electrically connected to the data line Data and the power signal line VDD corresponding to the aforementioned first pixel column segment and the data line Data and the power signal line VDD corresponding to the second pixel column segment, respectively.

As shown in FIG. 3, the wiring region B is arranged around the light transmittance region C, and is surrounded by the display region A. A width of a projection of the wiring region B on the base substrate is, for example, 250 μm~350 μm, that is, a distance between the light transmittance region C and the display region A is 250 μm~350 μm.

In the following, the wiring arrangement in the wiring region B in some embodiments of the present disclosure will be described in detail.

FIGS. 4-7 are schematic enlarged views of regions D, E, F, G in FIG. 3, respectively. In the wirings of FIGS. 4-7, wirings represented by the same type of lines are in the same layer, and the wirings represented by different types of lines are in different layers. The type mentioned herein refers to the thickness and the gray scale of the line, the thickness of the line is only for distinguishing the wiring of different layers, and does not represent the thickness of the wiring.

Figure 4:
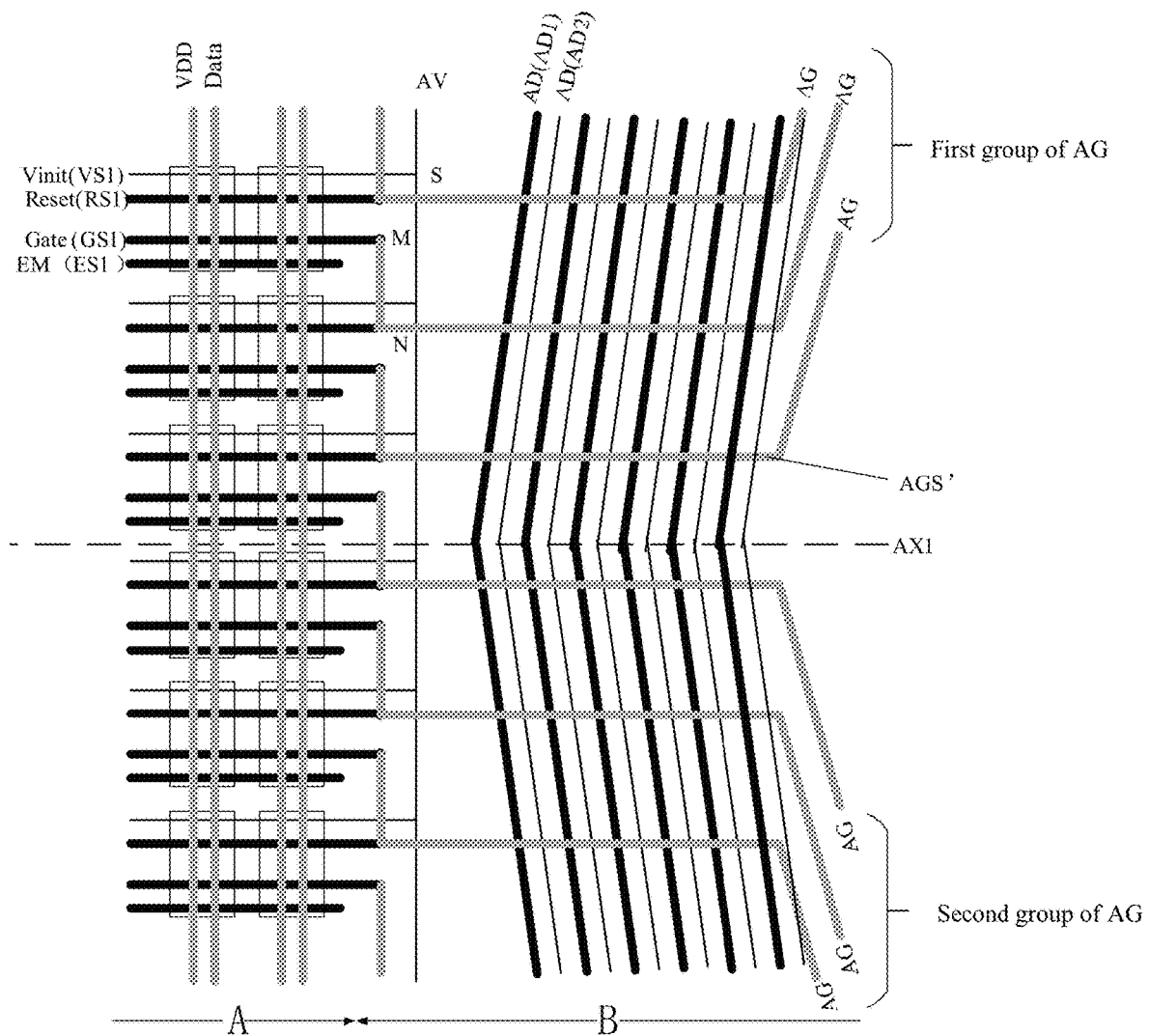
FIG. 4 is an enlarged view of the region D in FIG. 3.
Figure 5:
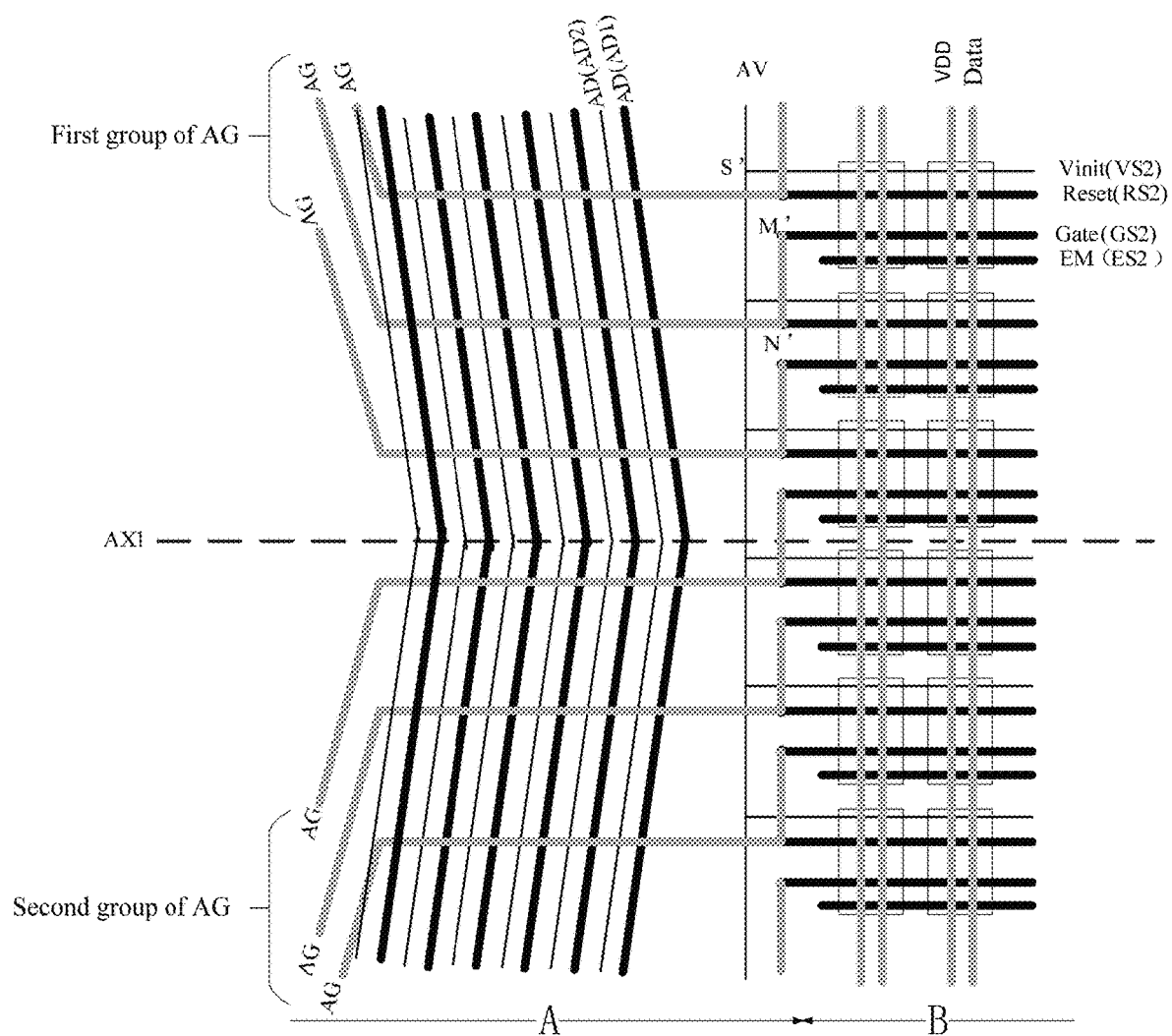
FIG. 5 is an enlarged view of the region E in FIG. 3.
Figure 6:
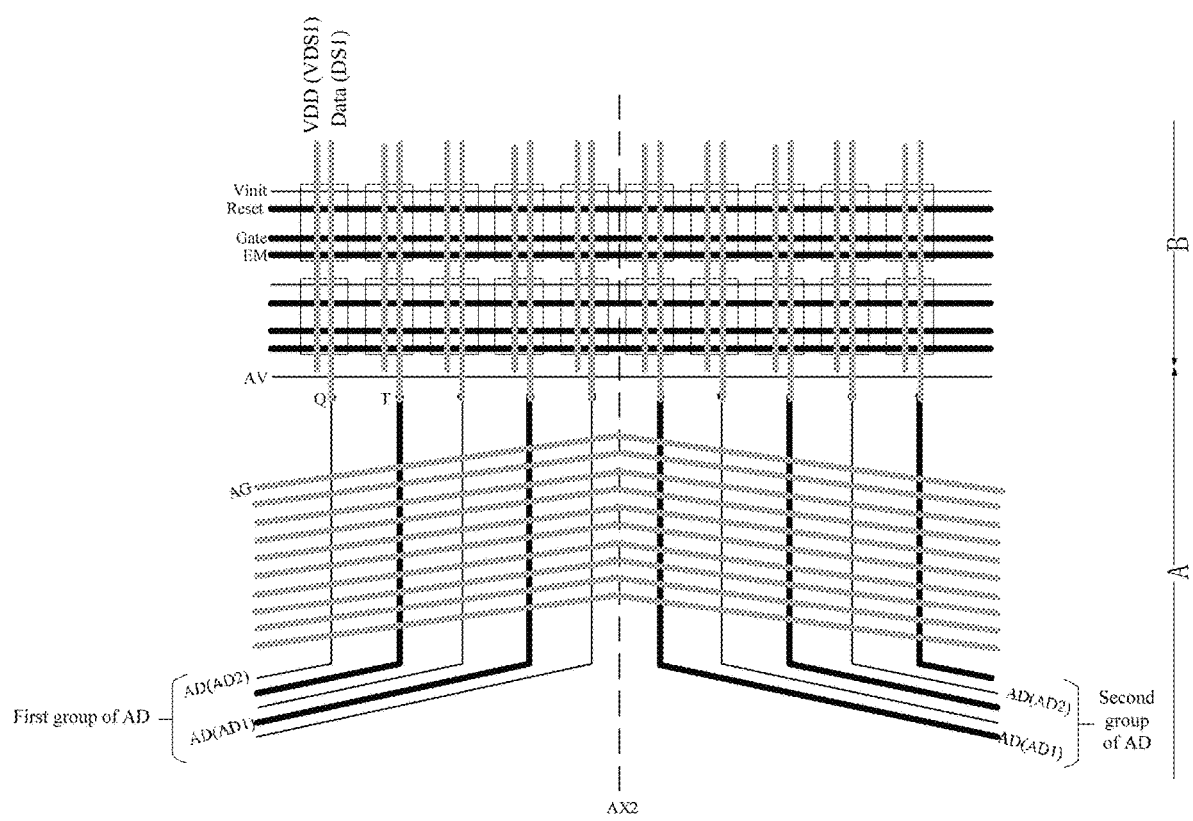
FIG. 6 is an enlarged view of the region F in FIG. 3.
Figure 7:
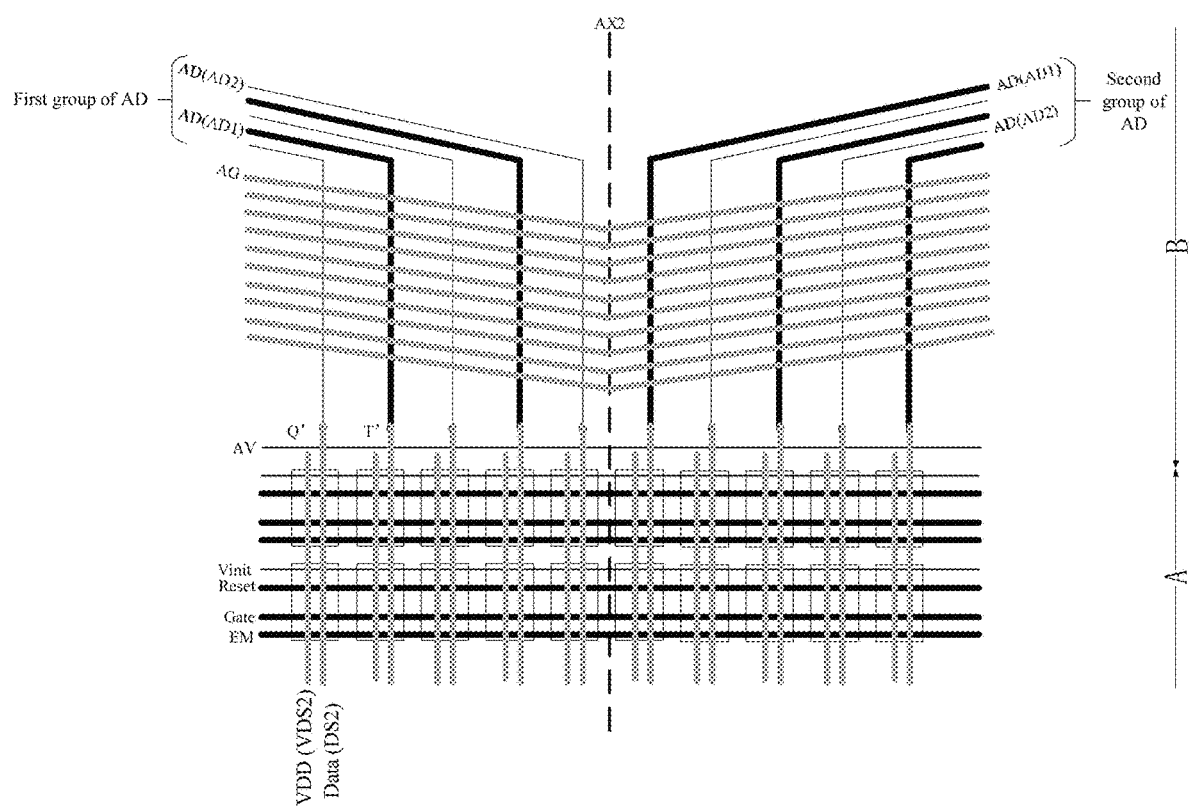
FIG. 7 is an enlarged view of the region G in FIG. 3.

As shown in FIGS. 3, 4, 5, each row of the plurality of rows of pixel circuits is divided into a first pixel circuit row segment and a second pixel circuit row segment by the light transmittance region C. As stated above, each row of the m rows of pixel circuits is divided into a first pixel circuit row segment and a second pixel circuit row segment by the light transmittance region C, m is a natural number and m≥2, for example, m is 50, 60, 70, 80, 90, 100. The specific value of m is related to the size of the hole and the size of the pixel. FIGS. 4 and 5 only show 6 rows of pixel circuits in the center of the m rows of pixel circuits for illustration. As shown in FIGS. 3, 6, and 7, each column of the plurality columns of pixel circuit is divided into a first pixel circuit column segment and a second pixel circuit column segment by the light transmittance region C. As stated above, each column of the n columns of pixel circuits is divided into a first pixel circuit column segment and a second pixel circuit column segment by the light transmittance region C, n is a natural number and n≥2, for example, n is 50, 60 70, 80, 90, 100. The specific value of n is related to the size of the hole and the size of the pixel. FIGS. 6 and 7 only show 10 columns of pixel circuits in the center of the n columns of pixel circuits for illustration.

As shown in FIGS. 3, 4, 5, each row of the m rows of pixel circuits divided by the light transmittance region C includes an initialization signal line Vinit, a reset signal line Reset, a gate line Gate and a light emitting control line EM, the initialization signal line Vinit is divided into a first initialization signal line portion VS1 and a second initialization signal line portion VS2 by the light transmittance region C, the reset signal line Reset is divided into a first reset signal line portion RS1 and a second reset signal line portion RS2 by the light transmittance region C, the gate line Gate is divided into a first gate line portion GS1 and a second gate line portion GS2 by the light transmittance region C, the light emitting control line EM is divided into a first light emitting control line portion ES1 and a second light emitting control line portion ES2 by the light transmittance region C. The first initialization signal line portion VS1, the first reset signal line portion RS1, the first gate line portion GS1 and the first light emitting control line portion ES1 are shown in FIG. 4, on the left side of the light transmittance region C. The second initialization signal line portion VS2, the second reset signal line portion RS2, the second gate line portion GS2 and the second light emitting control line portion ES2 are shown in FIG. 5, on the right side of the light transmittance region C.

As shown in FIGS. 3, 6, 7, each column of the n columns of pixel circuits includes a data line Data and a power signal line VDD, the data line Data is divided in a first data line portion DS1 and a second data line portion DS2 by the light transmittance region C, the power signal line VDD is divided into a first power signal line portion VDS1 and a second power signal line portion VDS2 by the light transmittance region C, the first data line portion DS1 and the first power signal line portion VDS1 are shown in FIG. 6, on the upper side of the light transmittance region C. The second data line portion DS2 and the second power signal line portion VDS2 are shown in FIG. 7, on the lower side of the light transmittance region C.

With reference to the combination of FIGS. 3-7, in some embodiments, for each row of the m rows of pixel circuits, the first gate line portion GS1 is connected to the second gate line portion GS2 through an auxiliary gate line AG. The auxiliary gate line AG and the gate line Gate are disposed on different layers, for example, the auxiliary gate line AG can be disposed in the same layer with the data line Data, those skilled in the art would understand that, the gate line Gate and the data line Data in the OLED display panel are disposed on different layers generally. At least part of the auxiliary gate line AG extends along an edge of the light transmittance region C, bypasses the light transmittance region C, and connects the first gate line portion GS1 and the second gate line portion GS2. The auxiliary gate line AG is a continuous line, FIG. 4 only shows a first segment of the auxiliary gate line AG, for example the left segment, FIG. 5 only shows a second segment of the auxiliary gate line AG, for example the right segment, FIG. 6 or FIG. 7 only show a third segment of the auxiliary gate line AG, for example the central segment. Those skilled in the art would understand that, the first segment, the second segment and the third segment are all parts of the auxiliary gate line AG, they are connected by wiring portions of the auxiliary gate line AG not shown in FIGS. 4-7.

Taking the uppermost pixel circuit row of FIGS. 4-5 as an example, as shown in FIG. 4, an end portion of the first gate line portion GS1 close to the light transmittance region C is jump-layer connected to a first end portion of the auxiliary gate line AG at M, for example, the end portion of the first gate line portion GS1 close to the light transmittance region C and the first end portion of the auxiliary gate line AG which are located in different layers are electrically connected through a via hole. As shown in FIG. 5, an end portion of the second gate line portion GS2 close to the light transmittance region C is jump-layer connected to a second end portion of the auxiliary gate line AG at M', for example, the end portion of the second gate line portion GS2 close to the light transmittance region C and the second end portion of the auxiliary gate line AG which are located in different layers are electrically connected through a via hole. In other embodiments, the auxiliary gate line AG can be in the same layer with the gate line Gate, while the auxiliary gate line AG and the first gate line portion GS1 and the second gate line portion GS2 of the gate line Gate can be integrally formed, and the jump-layer connection is not necessary.

As shown in FIGS. 3-5, the light transmittance region C has a first axis AX1 parallel to the row direction X, the m rows of pixel circuits divided by the light transmittance region C include a first group of rows of pixel circuits and a second group of rows of pixel circuits. The number of the rows of the first group of rows of pixel circuits and the number of the rows of the second group of rows of pixel circuits may be the same or different. The first group of rows of pixel circuits are located on one side of the first axis AX1, for example, on the upper side of the first axis AX1 as shown in FIGS. 3-5, and the second group of rows of pixel circuits are located on the other side of the first axis AX1, for example, on the lower side of the first axis AX1 as shown in FIGS. 3-5. Auxiliary gate lines AG for connecting first gate line portions GS1 and second gate line portions GS2 in the first group of rows of pixel circuits are all located on one side of the first axis AX1, for example, the upper side of the first axis AX1 as shown in FIGS. 3-5. Auxiliary gate lines AG for connecting first gate line portions GS1 and second gate line portions GS2 in the second group of rows of pixel circuits are all located on the other side of the first axis AX1, for example, the lower side of the first axis AX1 as shown in FIGS. 3-5. FIG. 6 shows the third segment, for example the central segment, of auxiliary gate lines AG for connecting first gate line portions GS1 and second gate line portions GS2 in the first group of rows of pixel circuits. FIG. 7 shows the third segment, for example the central segment, of auxiliary gate lines AG for connecting first gate line portions GS1 and second gate line portions GS2 in the second group of rows of pixel circuits.

As shown in FIG. 4, the first segment, for example, each of the left segments of m auxiliary gate lines AG corresponding to the m rows of pixel circuits includes a horizontal segment extending in the row direction X and a wiring segment whose extending direction is at a certain angle to the X direction. As shown in FIG. 5, the second segment, for example, each of the right segments of the m auxiliary gate lines AG corresponding to the m rows of pixel circuits includes a horizontal segment extending in the row direction X and a wiring segment whose extending direction is at a certain angle to the X direction. Those skilled in the art can understand that although the wiring segment shown in the drawing is straight, only part of the wiring segment is shown in the drawing, in the actual process, the wiring can be formed by connecting a plurality of line segments, the whole of which is arc-shaped. In some embodiments, the wiring may also be a smooth arc-like wiring.

Based on the abovementioned settings, for each row of the m rows of pixel circuits divided by the light transmittance region C, the first gate line portion GS1 is connected to the second gate line portion GS2 by the auxiliary gate line AG, thereby the first gate line portion GS1 and the second gate line portion GS2 of the gate line Gate in the same pixel circuit can transmit the same gate line signal simultaneously, so that the normal display of the OLED display panel can be ensured.

As shown in FIGS. 3 and 4, in some embodiments, for each row of the m rows of pixel circuits, the auxiliary gate line AG includes an auxiliary gate line sub-portion AGS, the auxiliary gate line sub-portion AGS is located on the side of the light transmittance region C close to the first gate line portion GS1, the auxiliary gate line sub-portion AGS extends in the row direction X. the auxiliary gate line sub-portion AGS and the auxiliary data line AD have an overlapped region. Areas of the overlapped regions of auxiliary gate line sub-portions AGS and the auxiliary data lines AD corresponding to at least two rows of the m rows of pixel circuits are different. As shown in FIG. 4, the auxiliary gate line sub-portion AGS of the auxiliary gate line AG away from the first axis AX1 is configured to overlap more auxiliary data lines AD relative to the auxiliary gate line sub-portion AGS of the auxiliary gate line AG close to the first axis AX1, that is, the overlapped region of the auxiliary gate line sub-portion AGS of the auxiliary gate line AG away from the first axis AX1 and the auxiliary data line AD can be larger relative to the auxiliary gate line sub-portion AGS of the auxiliary gate line AG close to the first axis AX1. Therefore, the gate line Gate corresponding to the auxiliary gate line AG away from the first axis AX1 can obtain a larger capacitance complementation. Those skilled in the art can understand that as shown in FIGS. 3 and 5, in some embodiments, for each row of the m rows of pixel circuits, the auxiliary gate line AG further includes another auxiliary gate line sub-portion AGS', the auxiliary gate line sub-portion AGS' is located on the side of the light transmittance region C close to the second gate line portion GS2, the auxiliary gate line sub-portion AGS' extends in the row direction X.

In some embodiments, for each row of the m rows of pixel circuits, the first reset signal segment RS1 and the second reset signal segment RS2 are connected through an auxiliary reset signal line in a manner similar to the connection of the first gate line portion GS1 and the second gate line portion GS2, however, this manner will increase the wiring, which could lead to the larger size of the wiring region B.

In some embodiments, in the m rows of pixel circuits divided by the light transmittance region C, pixel circuits from the first row to the $m_{th}$ row are scanned in sequence, the first reset signal line portion RS1 of the $i_{th}$ row of pixel circuits is electrically connected to the first gate line portion GS1 of the $i-1_{th}$ row of pixel circuits, the second reset signal line portion RS2 of the $i_{th}$ row of pixel circuits is electrically connected to the second gate line portion GS2 of the $i-1_{th}$ row of pixel circuits, wherein i is a natural number, and 1≤i≤m. In the sequentially scanned rows of pixel circuits in the OLED display panel, the signal transmitted by the reset signal line RS of each row of pixel circuits and the signal transmitted by the gate line of the previous row of pixel circuits. Therefore, for adjacent two rows of pixel circuits in the m rows of pixel circuits, the first reset signal line portion RS1 and the second reset signal line portion RS2 of a latter row of pixel circuits can be electrically connected by the auxiliary gate line AG corresponding to the former row of pixel circuits. Therefore, providing the auxiliary reset signal line separately is not necessary, which could reduce the size of the wiring region B, and increase the effective display region of the OLED display panel.

Specifically, as shown in FIGS. 3, 4, 5, rows of pixel circuits are scanned in sequence from up to down. Taking the uppermost two rows of pixel circuits in FIGS. 4, 5 as an example, an end portion of the first reset signal line portion RS1 of the lower row of pixel circuits close to the light transmittance region C and the auxiliary gate line AG corresponding to the upper row of pixel circuits are jump-layer connected at N, for example, through a via hole connection. An end portion of the second reset signal line portion RS2 of the lower row of pixel circuits close to the light transmittance region C and the auxiliary gate line AG corresponding to the upper row of pixel circuits are jump-layer connected at N', for example, through a via hole connection, therefore, the end portion of the first reset signal line portion RS1 of the lower row of pixel circuits close to the light transmittance region C and the first gate line portion GS1 of the upper row of pixel circuits are electrically connected through a first portion, between M and N, of the auxiliary gate line AG corresponding to the upper row of pixel circuits, the end portion of the second reset signal line portion RS2 of the lower row of pixel circuits close to the light transmittance region C and the second gate line portion GS2 of the upper row of pixel circuits are electrically connected through a second portion, between M' and N', of the auxiliary gate line AG corresponding to the upper row of pixel circuits. In some embodiments, the reset signal line Reset and the gate line Gate are disposed in the same layer, the auxiliary gate line AG and the data line Data are disposed in the same layer.

In some embodiments, all the first initialization signal line portions VS1 and the second initialization signal line portions VS2 in the m rows of pixel circuits divided by the light transmittance region C are connected to the same one auxiliary initialization signal line AV. In the OLED display panel, Vinit signals transmitted by initialization signal lines Vinit of all rows of pixel circuits are the same, which is a constant value. Therefore, all the first initialization signal line portions VS1 and the second initialization signal line portion VS2 of the m rows of pixel circuits can be connected to the same one auxiliary initialization signal line AV, the auxiliary initialization signal line AV is disposed around the light transmittance region C. The auxiliary initialization signal line AV is for example, disposed in the same layer with the initialization signal line Vinit.

Specifically, taking the uppermost row of pixel circuits in FIGS. 4, 5 as an example, an end portion of the first initialization signal line portion VS1 close to the light transmittance region C is electrically connected to the auxiliary initialization signal line AV at S, an end portion of the second initialization signal line portion VS2 close to the light transmittance region C is electrically connected to the auxiliary initialization signal line AV at S'. FIGS. 4-7 only show parts of the auxiliary initialization signal line AV, in some embodiments, the auxiliary initialization signal line AV may form a closed loop surrounding the light transmittance region C. As shown in FIGS. 4-7, the auxiliary initialization signal line AV is farther away from the light transmittance region relative to other auxiliary wirings.

In the abovementioned embodiment, due to only one auxiliary initialization signal line AV is provided, therefore, the size of the wiring region B can be reduced, and the effective display region of the OLED display panel can be increased. Due to the auxiliary initialization signal line AV is for example, disposed in the same layer with the initialization signal line Vinit, the auxiliary initialization signal line AV is for example, formed by the same patterning process using the same material with the initialization signal line Vinit including the first initialization signal line portion VS1 and the second initialization signal line portion VS2, the auxiliary initialization signal line AV and the first initialization signal line portion VS1 and the second initialization signal line portion VS2 are integrally formed, and do not need to be connected by using a particular connection process.

In some embodiments, for each row of the m rows of pixel circuits divided by the light transmittance region C, the first light emitting control line portion ES1 and the second light emitting control line portion ES2 can be connected by an auxiliary light emitting control line in a manner similar to the connection manner of the first gate line portion GS1 and the second gate line portion GS2, which will increase the wiring, so that the size of the wiring region B is large.

In some embodiments, end portions of all the first light emitting control line portions ES1 and the second light emitting control line portions ES2 in them rows of pixel circuits (divided by the light transmittance region C) close to the light transmittance region C are suspended. In these embodiments, for each row of pixel circuits in the OLED display panel, the light emitting control line EM can simultaneously feed the light emitting control signal from both ends located on the both sides of the OLED display panel, respectively. In actual applications, in the m rows of pixel circuits divided by the light transmittance region C, the requirements of the synchronization and co-amplitude of the light emitting control signal transmitted by the first light emitting control line portion ES1 and the light emitting control signal transmitted by the corresponding second light emitting control line portion ES2 are not high, end portions of the first light emitting control line portion ES1 and the second light emitting control line portion ES2 close to the light transmittance region C are suspended, the first light emitting control line portion ES1 and the second light emitting control line portion ES2 simultaneously feed light emitting control signals from end portions, away from the light transmittance region C, on both sides of the OLED display panel, so that the requirement of normal display of the OLED can be met. Therefore, it is not necessary to provide the auxiliary light emitting control line separately, and the size of the wiring region B can be reduced, and the effective display region of the OLED display panel can be increased.

With reference to the combination of FIGS. 3-7, in some embodiments, for each column of the n columns of pixel circuits divided by the light transmittance region C, the first data line portion DS1 is connected to the second data line portion DS2 through the auxiliary data line AD. The auxiliary data line AD and the data line Data are disposed in different layers, for example, the auxiliary data line ADA can be disposed in the same layer with the gate line Gate or the initialization signal line Vinit, those skilled in the art can understand that, the gate line Gate, the initialization signal line Vinit and the data line Data are disposed on different layers in the OLED display panel generally. At least part of the auxiliary data line AD extends along the edge of the light transmittance region C, bypasses the light transmittance region C, and connects the first data line portion DS1 and the second data line portion DS2. The auxiliary data line AD is a continuous line. FIG. 6 only shows a first segment of the auxiliary data line AD, for example, the upper segment, FIG. 7 only shows a second segment of the auxiliary data line AD, for example. the lower segment, FIG. 4 or 5 only shows a third segment of the auxiliary data line AD, for example, the central segment. Those skilled in the art can understand that the first, the second and the third segment of the auxiliary data line AD are all parts of the auxiliary data line AD, and they are connected by wiring portions of the auxiliary data line AD not shown in FIGS. 4-7. The auxiliary data line AD includes a first auxiliary data line AD1 and a second auxiliary data line AD2, for each column of the odd-numbered columns of the n columns of pixel circuits divided by the light transmittance region C, the first data line portion DS1 is connected to the second data line portion DS2 through the first auxiliary data line AD1. For each column of the even-numbered columns of the n columns of pixel circuits divided by the light transmittance region C, the first data line portion DS1 is connected to the second data line portion DS2 through the second auxiliary data line AD2. The first auxiliary data line AD1 can be disposed in the same layer with one of the gate line Gate and the initialization signal line Vinit, and the second auxiliary data line AD2 can be disposed in the same layer with the other one of the gate line Gate and the initialization signal line Vinit. For example, as shown in FIGS. 6, 7, the first auxiliary data line AD1 and the gate line Gate are disposed in the same layer, and the second auxiliary data line AD2 and the initialization signal line Vinit are disposed in the same layer. At least part of each of the first auxiliary data line AD1 and the second auxiliary data line AD2 extends along the edge of the light transmittance region C, bypasses the light transmittance region C, and connects the corresponding first data line portion DS1 and the second data line portion DS2.

Taking the leftmost two columns of pixel circuits in FIGS. 6, 7 as an example, as shown in FIG. 6, an end portion of the first data line portion DS1 of the left column of pixel circuits close to the light transmittance region C and a first end portion of the second auxiliary data line AD2 are jump-layer connected at Q, for example, electrically connected through a via hole; an end portion of the first data line portion DS1 of the right column of pixel circuits close to the light transmittance region C and a first end portion of the first auxiliary data line AD1 are jump-layer connected at T, for example, electrically connected through a via hole. As shown in FIG. 7, an end portion of the second data line portion DS2 of the left column of pixel circuits close to the light transmittance region C and a second end portion of the second auxiliary data line AD2 are jump-layer connected at Q', for example, electrically connected through a via hole; an end portion of the second data line portion DS2 of the right side column of pixel circuits close to the light transmittance region C and a second end portion of the first auxiliary data line AD1 are jump-layer connected at T', for example, electrically connected through a via hole. The first auxiliary data line AD1 and the gate line Gate are disposed in the same layer, the second auxiliary data line AD2 and the initialization signal line Vinit are disposed in the same layer.

In other embodiments, the auxiliary data line AD can be in the same layer with the data line Data, in this case, the auxiliary data line AD and the first data line portion DS1 and the second data line portion DS2 of the data line Data can be integrally formed, where the jump-layer connection is not necessary.

As shown in FIGS. 3, 6, 7, the light transmittance region C has a second axis AX2 parallel to the column direction Y, the n columns of pixel circuits divided by the light transmittance region C includes a first group of columns of pixel circuits and a second group of columns of pixel circuits. The column numbers of the first group of columns of pixel circuits and the second group of columns of pixel circuits can be the same or different. The first group of columns of pixel circuits is located on one side of the second axis AX2, for example, the left side of the second axis AX2 as shown in FIGS. 3, 6, 7, the second group of columns of pixel circuits is located on the other side of the second axis AX2, for example, the right side of the second axis AX2 as shown in FIGS. 3, 6, 7. Auxiliary data lines AD for connecting first data line portions DS1 and second data line portions DS2 of the first group of columns of pixel circuits are all located on one side of the second axis AX2, for example, the left side of the second axis AX2 as shown in FIGS. 3, 6, 7. Auxiliary data lines AD for connecting first data line portions DS1 and second data line portions DS2 of the second group of columns of pixel circuits are all located on the other side of the second axis AX2, for example, the right side of the second axis AX2 as shown in FIGS. 3, 6, 7. FIG. 4 shows the third segment, for example, the central segment of the auxiliary data line AD for connecting the first data line portion DS1 and the second data line portion DS2 of the first group of columns of pixel circuits. FIG. 5 shows the third segment, for example, the central segment of the auxiliary data line AD for connecting the first data line portion DS1 and the second data line portion DS2 of the second group of columns of pixel circuits.

As shown in FIG. 6, the first segment, for example, each of the upper segments of n auxiliary data lines AD corresponding to the n columns of pixel circuits includes a vertical segment extending in the column direction Y and a wiring segment whose extending direction is at a certain angle to the Y direction. As shown in FIG. 7, the second segment, for example, each of the lower segments of the n auxiliary data lines AD corresponding to the n columns of pixel circuits includes a vertical segment extending in the column direction Y and a wiring segment whose extending direction is at a certain angle to the Y direction. Those skilled in the art can understand that although the wiring segment shown in the drawing is straight, only part of the wiring segment is shown in the drawing, in the actual process, the wiring can be formed by connecting a plurality of line segments, the whole of which is arc-shaped.

As shown in FIGS. 3-7, an orthographic projection of the auxiliary initialization signal line AV one the base substrate surrounds an orthographic projection of the auxiliary data line AD including the first auxiliary data line AD1 and the second auxiliary data line AD2 on the base substrate.

Based on the above settings, for each column of the n columns of pixel circuits divided by the light transmittance region C, the first data line portion DS1 is connected to the second data line portion through the auxiliary data line AD, the first data line portion DS1 and the second data line portion DS2 of the data line Data of the same column of pixel circuits can transmit the same data line signal simultaneously, thereby ensuring the normal display of the OLED display panel. In addition, the first data line portion DS1 and the second data line portion DS2 of the odd-numbered column of pixel circuits are electrically connected by using the first auxiliary data line AD1, the first data line portion DS1 and the second data line portion DS2 of the even-numbered column of pixel circuits are electrically connected by using the second auxiliary data line AD2, and the first auxiliary data line AD1 and the second auxiliary data line AD2 are in different layers, so that the auxiliary data lines can be provided more densely, which will further reduce the size of the wiring region B, and increase the effective display region of the OLED display panel.

Figure 8:
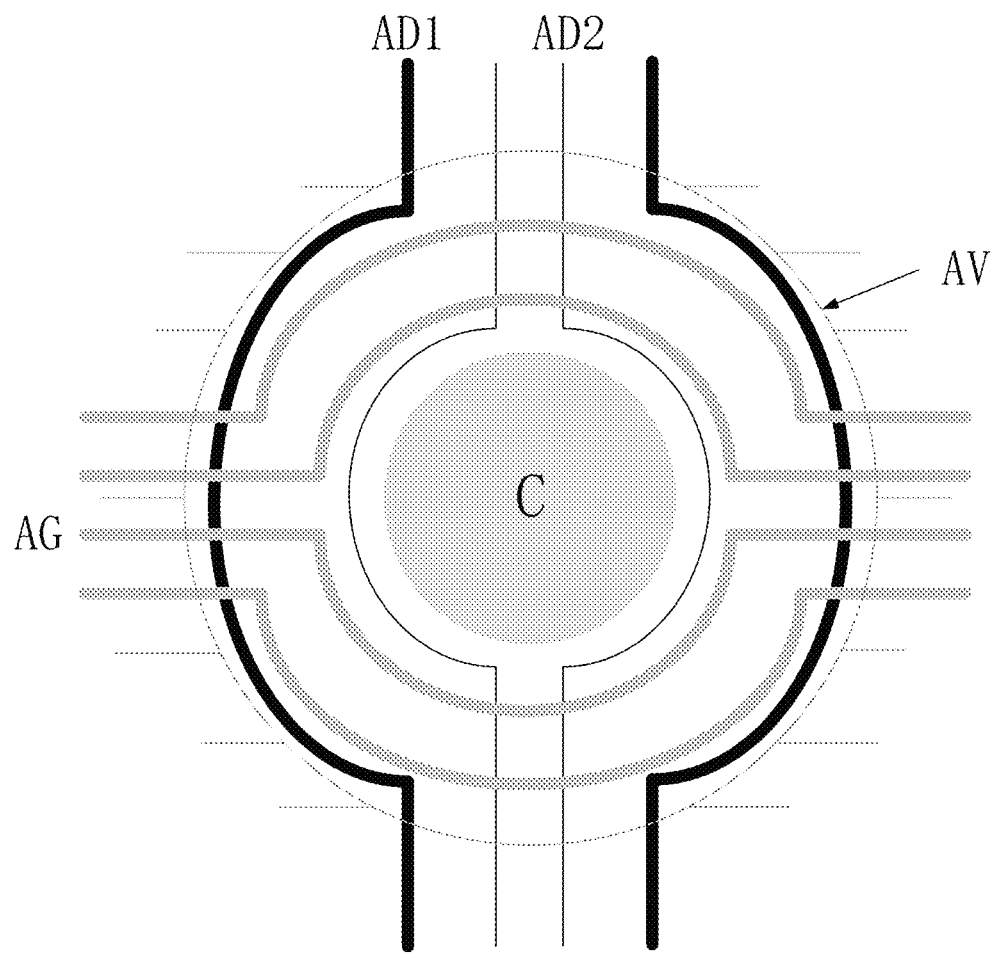
FIG. 8 is a schematic view of auxiliary wirings around the light transmittance region C.

The above FIGS. 4-7 only respectively show schematic views of regions D, E, F, G in FIG. 3, each of FIGS. 4-7 only shows a part of the auxiliary wiring, that is, a part of the auxiliary gate line AG, a part of the auxiliary data line AD and a part of the auxiliary initialization signal line AV. FIG. 8 is a schematic view of the auxiliary wiring around the light transmittance region C, schematically illustrates an overall appearance of various auxiliary wirings around the light transmittance region C. As shown in FIG. 8, some auxiliary gate lines AG bypass the light transmittance region C from the upper side of the light transmittance region C, and some other auxiliary gate lines AG bypass the light transmittance region C from the lower side of the light transmittance region C. Apart of the first auxiliary data lines AD1 and a part of the second auxiliary data lines AD2 bypass the light transmittance region C from the left side of the light transmittance region C, the other part of the first auxiliary data lines AD1 and the other part of the second auxiliary date lines AD2 bypass the light transmittance region C from the right side of the light transmittance region C. the auxiliary initialization signal line AV surrounds the light transmittance region C, and is in a ring shape, wiring portions of various auxiliary wirings surrounding the light transmittance region C are substantially arc-shaped. Those skilled in the art can understand that, FIG. 8 only schematically illustrates the overall appearance of various auxiliary wirings, that is, the auxiliary gate lines AG, the first auxiliary data lines AD1, the second auxiliary date lines AD2 and the auxiliary initialization signal lines AV, which does not represent the actual relative positional relationships between them. In some embodiments, in the region D shown in FIG. 3 (FIG. 4 is an enlarged view of the region D), the first auxiliary data lines AD1 corresponding to the odd-numbered columns of pixel circuits and the second auxiliary data lines AD2 corresponding to the even-numbered columns of pixel circuits are disposed alternately in the row direction X. An interval of orthographic projections of adjacent first auxiliary data line AD1 and second auxiliary data line AD2 on the base substrate is small, for example, orthographic projections of adjacent first auxiliary data line AD1 and second auxiliary data line AD2 on the base substrate substantially abut each other. Therefore, the first auxiliary data line AD1 and the second auxiliary data line AD2 can be arranged densely, so that the space occupied by the wiring region B is small.

Although in the previous embodiment, the first auxiliary data line AD1 corresponding to the odd-numbered column of pixel circuits and the second auxiliary data line AD2 corresponding to the even-numbered column of pixel circuits are disposed on different layers, however, those skilled in the art can understand that, in other embodiments, all the auxiliary data lines AD can be disposed in the same layer without distinguishing the first auxiliary data line AD1 and the second auxiliary data line AD2, for example, in the same layer with one of the gate line Gate and the initialization signal line.

In some embodiments, for each column of the n columns of pixel circuits divided by the light transmittance region C, the first reset signal segment RS1 and the second reset signal segment RS2 are connected via an auxiliary reset signal line in a manner similar to the connection of the first gate line portion GS1 and the second gate line portion GS2, however, this manner will increase the wirings, which could lead to the larger size of the wiring region B.

In some embodiments, end portions of all the first power signal line portions VDS1 and the second power signal line portions VDS2 of the n columns of pixel circuits (divided by the light transmittance region C) close to the light transmittance region C are suspended. In these embodiments, due to the design of pixel circuits in the OLED display panel, power signal lines VDD of all the pixel circuits will be electrically connected via other conductive layers, therefore it is not necessary to provide the auxiliary power signal line to electrically connect the first power signal line portion VDS1 and the second power signal line portion VDS2. The size of the wiring region B can be reduced, and the effective display region of the OLED display panel can be increased.

Figure 9:
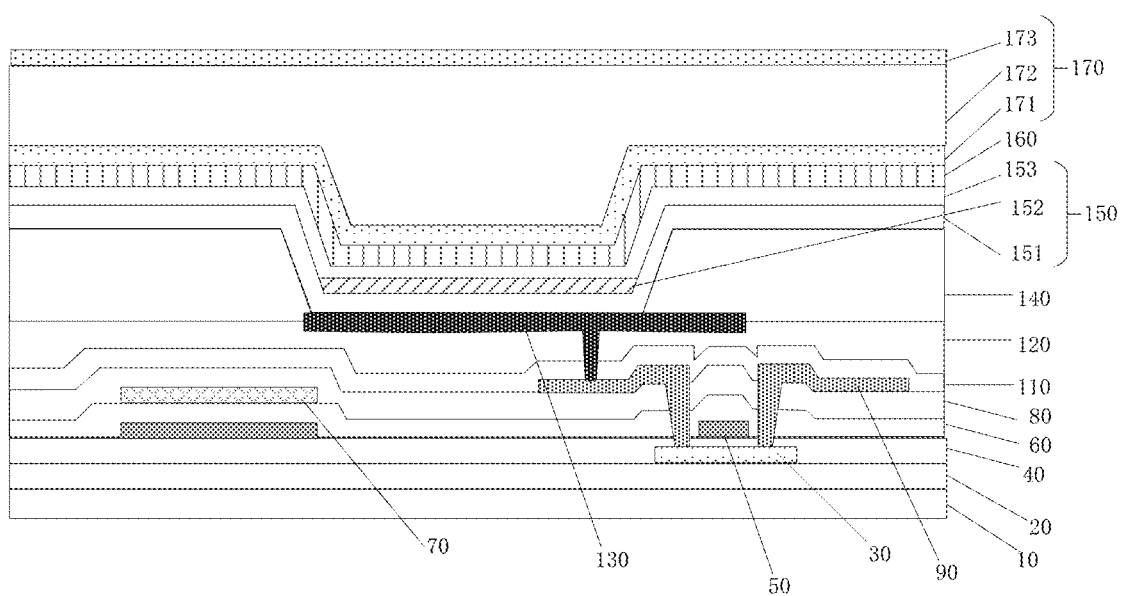
FIG. 9 is a partial schematic cross-sectional view of the display region A in FIG. 3.

FIG. 9 is a partial schematic cross-sectional view of the display region A in FIG. 3. as shown in FIG. 9, in some embodiments, the OLED display panel includes a base substrate 10 and a buffer layer 20, an active layer 30, a first gate insulating layer 40, a first gate layer 50, a second gate insulating layer 60, a second gate layer 70, an interlayer dielectric layer 80, a source/drain layer 90, a passivation layer 110, a planarization layer 120, an anode layer 130, a pixel define layer 140, a light emitting function layer 150, a cathode layer 160 and an encapsulating layer 170 on the base substrate 10 in sequence.

Specifically, the base substrate 10 is, for example, a flexible PI (polyimide) substrate made of transparent materials.

The buffer layer 20 is made of transparent insulating material, such as silicon oxide, silicon nitride, etc., and substantially covers the entire surface of the base substrate 10; the entire surface coverage described herein can be understood as a coverage area greater than 50%.

The active layer 30 includes an active region in the thin film transistor in the pixel circuit, which is made of semiconductor material, and has poor light transmittance.

The first gate insulating layer 40 is made of transparent insulating material, such as silicon oxide, silicon nitride, etc., and basically covers the entire surface of the base substrate 10.

The first gate layer 50 is made of metal material, and includes the reset signal line Reset, the gate line Gate, and the light emitting control line EM in the pixel circuit and the gate in the thin film transistor, that is, the reset signal line Reset, the gate line Gate, the light emitting control line EM, and the gate in the thin film transistor are arranged in the same layer located in the first gate layer 50, and can be formed by the same patterning process;

The second gate insulating layer 60 is made of transparent insulating material, such as silicon oxide, silicon nitride, etc., and basically covers the entire surface of the base substrate 10;

The second gate layer 70 includes the initialization signal line Vinit in the pixel circuit, that is, the reset signal line Reset, the gate line Gate and the light emitting control line EM in the pixel circuit and the gate in the thin film transistor are arranged in the same layer, located in the second gate layers 70, and can be formed by the same patterning process.

The interlayer dielectric layer 80 is made of transparent material, such as silicon oxide, silicon nitride, etc., and basically covers the entire surface of the base substrate 10;

The source and drain layer 90 is made of metal material, and includes the data line Data and the power signal line VDD in the pixel circuit, and the source and drain of the thin film transistor, that is, the data line Data and the power signal line VDD in the pixel circuit and the source and drain in the thin film transistor are arranged in the same layer, located in the source and drain layer 90, and can be formed by the same patterning process;

The passivation layer 110 is made of transparent insulating material, such as silicon oxide, silicon nitride, etc., and basically covers the entire surface of the base substrate 10.

The planarization layer 120 is made of transparent organic material, such as silicon oxide, silicon nitride, etc., and substantially covers the entire surface of the base substrate 10.

The anode layer 130 is made of metal material, including the anode of the OLED source, and the anode of the OLED source can be formed by a patterning process.

The pixel define layer 140 is supported by transparent organic material for defining the light emitting region of the OLED display panel, and can be formed by a patterning process.

The light emitting function layer 150 includes a first particle transport layer 151, a light emitting layer 152, a second particle transport layer 153 arranged away from the base substrate 10 in sequence, wherein the first particle transport layer 151 includes, for example, a hole injection layer, a hole transport layer, an electron block layer, etc., the second particle transport layer 153 includes, for example, an electron injection layer, an electron transport layer, a hole block layer, etc., the first particle transport layer 151 and the second particle transport layer 153 both cover the entire surface of the base substrate 10, and are made of transparent materials. The light emitting layer 152 is only provided in a light emitting region defined by the pixel define layer 140, and can be made through evaporation with a FMM mask.

The cathode layer 160 is made of transparent conductive material, for example, ITO, ZnO, etc., and basically covers the entire surface of the base substrate 10.

The encapsulating layer 170 includes a first inorganic encapsulating layer 171, an organic encapsulating layer 172 and a second inorganic encapsulating layer 173 arranged away from the base substrate 10 in sequence, the first inorganic encapsulating layer 171, the organic encapsulating layer 172 and the second inorganic encapsulating layer 173 overlap with each other, and basically cover the entire base substrate 10, the encapsulating layer 170 is transparent.

Those skilled in the art should understand that FIG. 9 only schematically shows a cross-sectional structure of the display region A of the OLED display panel, which mainly reflects the layer structure constituting the OLED display panel, and reflects that the signal of pixel circuits is transmitted to the OLED element through the thin film transistor to realize the light emission of the OLED element.

Figure 10:
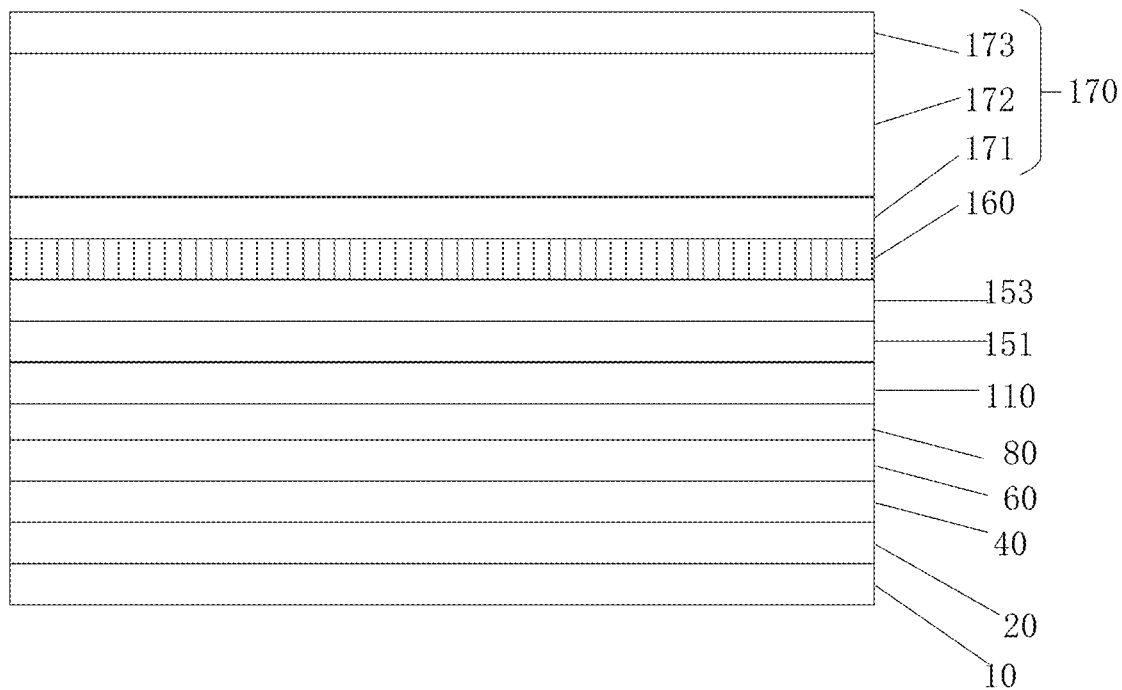
FIG. 10 is a partial schematic cross-sectional view of the light transmittance region C in FIG. 3.

FIG. 10 is a partial cross-sectional view of the light transmittance region C in FIG. 3. In some embodiments, in the light transmittance region C, the OLED display panel includes a base substrate 10 and a buffer layer 20, a first gate insulating layer 40, a second gate insulating layer 60, an interlayer dielectric layer 80, a passivation layer 110, a first particle transport layer 151, a second particle transport layer 153, a cathode layer 160 and an encapsulating layer 170 arranged on the base substrate 10 in sequence.

Compared with the partial cross-sectional schematic diagram of the display region A of the OLED display panel shown in FIG. 9, it can be seen that in the light transmittance region C, there is no active layer 30 made of semiconductor material, there is no first gate layer 50, second gate layer 70, source/drain layer 90 and anode layer 130 made of metal materials; there is no planarization layer 120 made of thick organic material and pixel define layer, and there is no light emitting layer 152. At this time, a total thickness of the film layers in the light transmittance region C is significantly smaller than the total thickness of the film layers in the display region A, and it can be considered that a blind hole is formed in the light transmittance region C, therefore the light transmittance region C can transmit as much external light as possible, so that the image acquisition device located on one side of the OLED display panel has a better imaging effect.

In short, in the light transmittance region C, film layers made of metal materials which block the transmitting of light, film layers formed by patterning and organic film layers with large thicknesses in the OLED display panel are removed, so that the light transmittance region C has good light transmittance.

In some embodiments, at least one layer of the buffer layer 20, the first gate insulating layer 40, the second gate insulating layer 60, the interlayer dielectric layer 80, the passivation layer 110, the first particle transport layer 151, the second particle transport layer 153, the cathode layer 160 and the encapsulating layer 170 of the OLED display panel on the base substrate 10 can be removed in the light transmittance region C, which further increase the light transmittance of the light transmittance region C.

Figure 11:
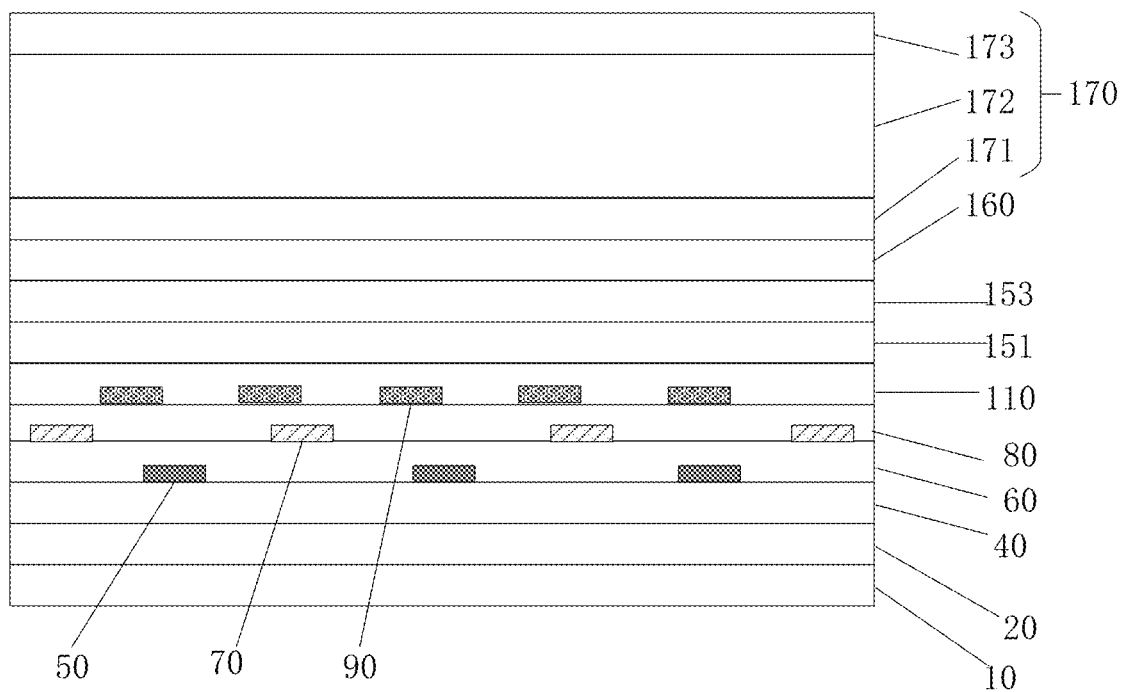
FIG. 11 is a partial schematic cross-sectional view of the wiring region B in FIG. 3.

FIG. 11 is a partial schematic cross-sectional view of the wiring region B in FIG. 3. In some embodiments, in the wiring region B, the OLED display panel includes a base substrate 10 and a buffer layer 20, a first gate insulating layer 40, a first gate layer 50, a second gate insulating layer 60, a second gate layer 70, an interlayer dielectric layer 80, a source/drain layer 90, a passivation layer 110, a first particle transport layer 151, a second particle transport layer 153, a cathode layer 160 and an encapsulating layer 170 arranged on the base substrate 10 in sequence.

Compared with the partial schematic cross-sectional view of the light transmittance region C of the OLED display panel shown in FIG. 11, it can be seen that in the wiring region B, the first gate layer 50, the second gate layer 70 and the source/drain layer 90 are added, the first gate layer 50 is used to form the first auxiliary data line AD1, the second gate layer 70 is used to form the second auxiliary data line AD2 and the auxiliary initialization signal line AV, and the source/drain layer 90 is used to form the auxiliary gate line AG.

Those skilled in the art should understand that, FIG. 11 only schematically shows the cross-sectional structure of the wiring region B of the OLED display panel, which mainly reflects the layer structure of the OLED display panel in the wiring region B.

Figure 12:
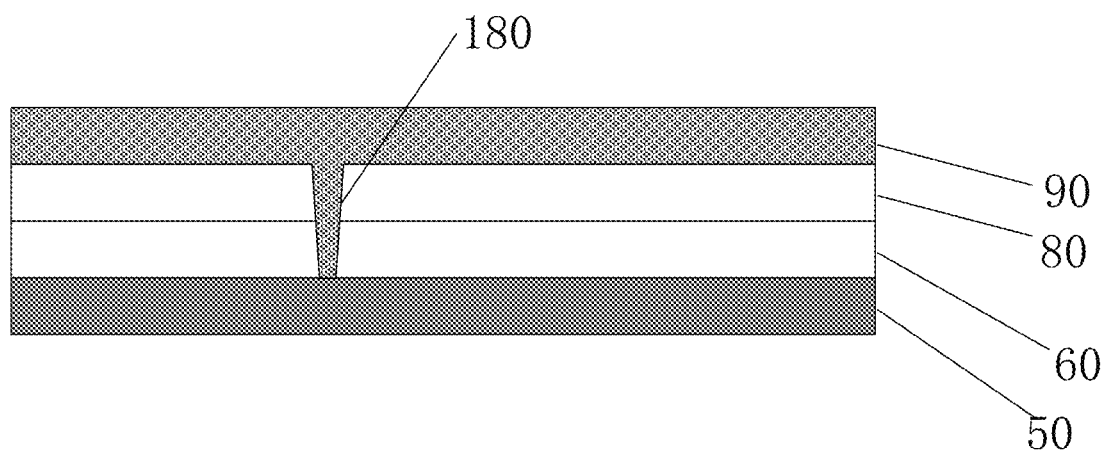
FIG. 12 is a cross-sectional view of M in FIG. 4.

FIG. 12 is a cross-sectional view of the M in FIG. 4, as shown in FIG. 12, at M, the end portion of the first gate line portion GS1 in the first gate layer 50 close to the light transmittance region C is electrically connected to the first end portion of the auxiliary gate line AG in the source/drain layer 90 through a first via hole 180. Wherein the first via hole 180 runs through both the second gate insulating layer 60 and the interlayer dielectric layer 80 located between the first gate layer 50 and the source/drain layer 90.

The jump-layer connection structures at M', N, N', Q, T, Q', T' in FIGS. 4-7 are similar to the jump-layer connection structure at M in FIG. 4, which will not be repeated here.

Aforementioned embodiments explain the wiring structure around the light transmittance region C of the OLED display panel without a physical through hole in detail, however, those skilled in the art can understand that, the wiring structure around the light transmittance region C can also be applied to the OLED display panel with a physical through hole.

In the previous embodiment, the OLED display panel has a source/drain layer, in other embodiments, the OLED display panel can further has two source/drain layers, that is, a first source/drain layer and a second source/drain layer in different layers, the first source/drain layer is used to form the data line in the pixel circuit and the source and drain of the thin film transistor, the second source/drain layer is used to form the power signal line. At this time, the auxiliary gate line can also be disposed in the second source/drain layer, for example, a part of the auxiliary gate line is disposed in the first source/drain layer, the other part of the auxiliary gate line is disposed in the second source/drain layer.

Those skilled in the art should understand that the previous embodiments take the OLED display panel as the example for explanation, however in other embodiments, other types of display panels, for example PLED display panel, etc. can also be used.

Figure 13:
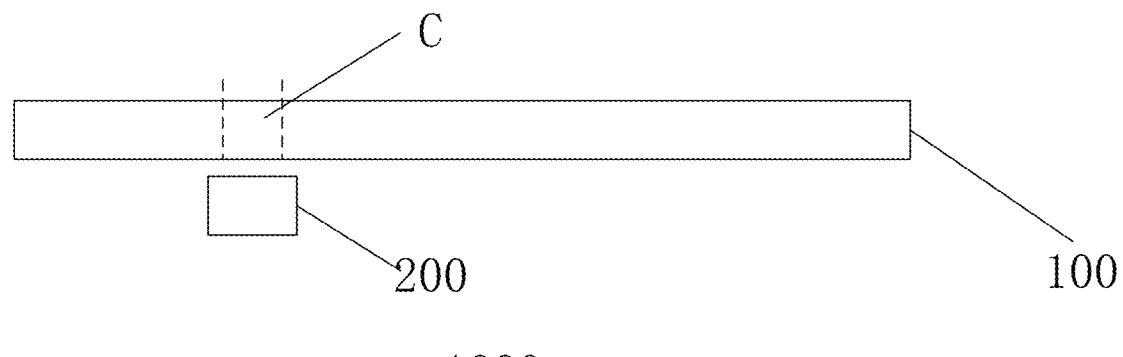
FIG. 13 is a schematic plan view of the OLED display device according to some embodiments of the present disclosure.

Some embodiments of the present disclosure further provide a display device, FIG. 13 is a schematic plan view of the OLED display device according to some embodiments of the present disclosure, as shown in FIG. 13, the display device 1000 includes the display panel 100 according to any the previous embodiments and an image acquisition device 200, for example, a camera that located on a side of the display panel away from the display surface 101. The display device can be any product or component with display and camera functions such as: television, display, digital frame, mobile phone, smart watch, tablet computer, etc.

In some embodiments, an orthographic projection of the image acquisition device 200 on the display panel 100 at least partially overlaps the light transmittance region C, therefore, the image acquisition device 200 acquires external light pass through the light transmittance region C of the display panel 100, thereby realizing the imaging.

In some embodiments, an optical axis of the image acquisition device 200 coincides with the third axis of the light transmittance region C of the display panel 100 perpendicular to the display panel 100.

The above description is only an explanation of preferred embodiments of the present disclosure and the applied technical principles. Those skilled in the art should understand that the scope of the invention involved in the present disclosure is not limited to the technical solutions formed by the specific combination of the above technical features, and should also cover other technical solutions formed by any combination of the above technical features and equivalent features thereof without departing from the inventive concept. For example, a technical solution formed by mutual replacing the above features and the technical features disclosed (but not limited to) in the present disclosure with similar functions.

What is claimed is:

1. A display panel, comprising:
   a base substrate; and
   pixel circuits arranged in an array on the base substrate, wherein each row of pixel circuits comprises a gate line extending in a row direction, each column of pixel circuits comprises a data line extending in a column direction, the gate line and the data line are disposed on different layers,
   wherein the display panel comprises a light transmittance region and a display region around the light transmittance region, the pixel circuits are disposed in the display region, the gate line of each row of m rows of pixel circuits is divided into a first gate line portion and a second gate line portion by the light transmittance region, the first gate line portion is connected to the second gate line portion by an auxiliary gate line, at least part of the auxiliary gate line extends along an edge of the light transmittance region, wherein m is a natural number and m≥2,
   wherein the data line of each column of n columns of pixel circuits is divided into a first data line portion and a second data line portion by the light transmittance region, the first data line portion is connected to the second data line portion by an auxiliary data line, wherein n is a natural number and n≥2,
   wherein the auxiliary gate line comprises an auxiliary gate line sub-portion, the auxiliary gate line sub-portion and the auxiliary data line have an overlapped region,
   wherein the m rows of pixel circuits comprise at least two rows of pixel circuits, an overlapped area of the auxiliary gate line sub-portion of the auxiliary gate line for connecting the first gate line portion and the second gate line portion in one row of the at least two rows of pixel circuits and the auxiliary data line is different from an overlapped area of the auxiliary gate line sub-portion of the auxiliary gate line for connecting the first gate line portion and the second gate line portion in the other one row of the at least two rows of pixel circuits and the auxiliary data line,
   wherein each row of pixel circuits further comprises a reset signal line extending in the row direction, the reset signal line and the gate line are disposed in the same layer and parallel to each other, the reset signal line of each row of the m rows of pixel circuits is divided into a first reset signal line portion and a second reset signal line portion by the light transmittance region,
   wherein in the m rows of pixel circuits, the first reset signal line portion of the $i_{th}$ row of pixel circuits is electrically connected to the first gate line portion of the $i-1_{th}$ row of pixel circuits, the second reset signal line portion of the $i_{th}$ row of pixel circuits is electrically connected to the second gate line portion of the $i-1_{th}$ row of pixel circuits, wherein i is a natural number, and 1<i≤m.

2. The display panel according to claim 1, wherein the auxiliary gate line sub-portion is located on a side of the light transmittance region close to the first gate line portion, and the auxiliary gate line sub-portion extends in the row direction.

3. The display panel according to claim 2, wherein a number of the auxiliary data line overlapping the auxiliary gate line sub-portion of the auxiliary gate line for connecting the first gate line portion and the second gate line portion in the one row of the at least two rows of pixel circuits is different from a number of the auxiliary data line overlapping the auxiliary gate line sub-portion of the auxiliary gate line for connecting the first gate line portion and the second gate line portion in the other one row of the at least two rows of pixel circuits.

4. The display panel according to claim 1, wherein the light transmittance region has a first axis parallel to the row direction, a first group of rows of pixel circuits of the m rows of pixel circuits are located on one side of the first axis, a second group of rows of pixel circuits are located on the other side of the first axis, auxiliary gate lines for connecting the first gate line portions and the second gate line portions in the first group of rows of pixel circuits are all located on the one side of the first axis, and auxiliary gate lines for connecting the first gate line portions and the second gate line portions in the second group of rows of pixel circuits are located on the other side of the first axis.

5. The display panel according to claim 1, wherein the auxiliary gate line and the data line are disposed in the same layer, at least part of the auxiliary data line extends along the edge of the light transmittance region, the auxiliary data line for connecting the first data line portion and the second data line portion of each column of at least part of the n columns of pixel circuits and the gate line are disposed in the same layer.

6. The display panel according to claim 1, wherein an end portion of the first reset signal line of the $i_{th}$ row of pixel circuits close to the light transmittance region is electrically connected to an end portion of the first gate line portion of the $i-1_{th}$ row of pixel circuits close to the light transmittance region by a first portion of the auxiliary gate line for connecting the first gate line portion and the second gate line portion of the $i-1_{th}$ row of pixel circuits, and an end portion of the second reset signal line of the $i_{th}$ row of pixel circuits close to the light transmittance region is electrically connected to an end portion of the second gate line portion of the $i-1_{th}$ row of pixel circuits close to the light transmittance region by a second portion of the auxiliary gate line for connecting the first gate line portion and the second gate line portion of the $i-1_{th}$ row of pixel circuits.

7. The display panel according to claim 1, wherein each column of pixel circuits further comprises a power signal line extending in the column direction, the power signal line and the data line are disposed in the same layer and parallel to each other, the power signal line of each column of the n columns of pixel circuits is divided into a first power signal line portion and a second power signal line portion by the light transmittance region, end portions of the first power signal line portion and the second power signal line portion close to the light transmittance region are suspended.

8. The display panel according to claim 1, wherein the display panel has a wiring region, the wiring region is located between the light transmittance region and the display region, the wiring region surrounds the light transmittance region, and is surrounded by the display region, the auxiliary gate line is located in the wiring region.

9. The display panel according to claim 8, wherein the display panel comprises, in the wiring region, a first gate layer, a second gate insulating layer, a second gate layer, an interlayer dielectric layer and a source/drain layer arranged away from the base substrate in sequence, the gate line is located on the first gate layer, the data line and the auxiliary gate line are located in the source/drain layer, an end portion of the first gate line portion close to the light transmittance region is electrically connected to a first end portion of the auxiliary gate line through a first via hole, an end portion of the second gate line portion close to the light transmittance region is electrically connected to a second end portion of the auxiliary gate line through a second via hole, the first via hole and the second via hole run through the second gate insulating layer, the interlayer dielectric layer between the first gate layer and the source/drain layer.

10. The display panel according to claim 8, further comprises a cathode layer on the base substrate, and an encapsulating layer on one side of the cathode layer away from the base substrate, the encapsulating layer comprises a first inorganic encapsulating layer, an organic encapsulating layer and a second inorganic encapsulating layer arranged away from the base substrate in sequence.

11. The display panel according to claim 1, wherein the light transmittance region comprises a light-transmitting blind hole or a light-transmitting through hole.

12. A display device, comprising:
the display panel according to claim 1,
an image acquisition device, being located on one side of the display panel away from the display surface.

13. A display panel, comprising:
a base substrate; and
pixel circuits arranged in an array on the base substrate,
wherein each row of pixel circuits comprises a gate line extending in a row direction, each column of pixel circuits comprises a data line extending in a column direction, the gate line and the data line are disposed on different layers,
wherein the display panel comprises a light transmittance region and a display region around the light transmittance region, the pixel circuits are disposed in the display region, the gate line of each row of m rows of pixel circuits is divided into a first gate line portion and a second gate line portion by the light transmittance region, the first gate line portion is connected to the second gate line portion by an auxiliary gate line, at least part of the auxiliary gate line extends along an edge of the light transmittance region, wherein m is a natural number and m≥2,
wherein the data line of each column of n columns of pixel circuits is divided into a first data line portion and a second data line portion by the light transmittance region, the first data line portion is connected to the second data line portion by an auxiliary data line, wherein n is a natural number and n≥2,
wherein the auxiliary gate line comprises an auxiliary gate line sub-portion, the auxiliary gate line sub-portion and the auxiliary data line have an overlapped region,
wherein the m rows of pixel circuits comprise at least two rows of pixel circuits, an overlapped area of the auxiliary gate line sub-portion of the auxiliary gate line for connecting the first gate line portion and the second gate line portion in one row of the at least two rows of pixel circuits and the auxiliary data line is different from an overlapped area of the auxiliary gate line sub-portion of the auxiliary gate line for connecting the first gate line portion and the second gate line portion in the other one row of the at least two rows of pixel circuits and the auxiliary data line,
wherein each row of pixel circuits further comprises an initialization signal line extending in the row direction, the initialization signal line, the gate line and the data line are located on different layers with, the initialization signal line of each row of the m rows of pixel circuits is divided into a first initialization signal line portion and a second initialization signal line portion by the light transmittance region, first initialization signal line portions and second initialization signal line portions of at least two rows of the m rows of pixel circuits are connected to an auxiliary initialization signal line, the auxiliary initialization signal line is disposed in the same layer with the initialization signal line, and is disposed around the light transmittance region.

14. The display panel according to claim 13, wherein at least part of the auxiliary data line extends along the edge of the light transmittance region, the auxiliary data line for connecting the first data line portion and the second data line portion of each column of at least part of the n columns of pixel circuits and the initialization signal line are disposed in the same layer.

15. The display panel according to claim 13, wherein the first data line portion of each column of odd-numbered columns of the n columns of pixel circuits is connected to the second data line portion of the same column of pixel circuits by a first auxiliary data line, the first data line portion of each column of even-numbered columns of the n columns of pixel circuits is connected to the second data line portion of the same column of pixel circuits by a second auxiliary data line, the first auxiliary data line is disposed in the same layer as one of the gate line and the initialization signal line, the second auxiliary data line is disposed in the same layer with the other one of the gate line and the initialization signal line, at least part of the first auxiliary data line extends along the edge of the light transmittance region, and at least part of the second auxiliary data line extends along the edge of the light transmittance region.

16. The display panel according to claim 15, wherein the light transmittance region has a second axis parallel to the column direction, a first group of columns of pixel circuits of the n columns of pixel circuits are located on one side of the second axis, a second group of columns of pixel circuits are located on the other side of the second axis, first auxiliary data lines or second auxiliary data lines for connecting first data line portions and second data line portions in the first group of columns of pixel circuits are all located on the one side of the second axis, and the first auxiliary gate data lines and the second auxiliary data lines for connecting first gate line portions and second gate line portions in the second group of columns of pixel circuits are located on the other side of the second axis.

17. The display panel according to claim 15, wherein an orthographic projection of the auxiliary initialization signal line on the base substrate surrounds orthographic projections of the first auxiliary data line and the second auxiliary data line on the base substrate.

18. The display panel according to claim 13, wherein the auxiliary initialization signal line is a closed loop.

19. A display panel, comprising:
- a base substrate; and
- pixel circuits arranged in an array on the base substrate, wherein each row of pixel circuits comprises a gate line extending in a row direction, each column of pixel circuits comprises a data line extending in a column direction, the gate line and the data line are disposed on different layers,
- wherein the display panel comprises a light transmittance region and a display region around the light transmittance region, the pixel circuits are disposed in the display region, the gate line of each row of m rows of pixel circuits is divided into a first gate line portion and a second gate line portion by the light transmittance region, the first gate line portion is connected to the second gate line portion by an auxiliary gate line, at least part of the auxiliary gate line extends along an edge of the light transmittance region, wherein m is a natural number and m≥2,
- wherein the data line of each column of n columns of pixel circuits is divided into a first data line portion and a second data line portion by the light transmittance region, the first data line portion is connected to the second data line portion by an auxiliary data line, wherein n is a natural number and n≥2,
- wherein the auxiliary gate line comprises an auxiliary gate line sub-portion, the auxiliary gate line sub-portion and the auxiliary data line have an overlapped region,
- wherein the m rows of pixel circuits comprise at least two rows of pixel circuits, an overlapped area of the auxiliary gate line sub-portion of the auxiliary gate line for connecting the first gate line portion and the second gate line portion in one row of the at least two rows of pixel circuits and the auxiliary data line is different from an overlapped area of the auxiliary gate line sub-portion of the auxiliary gate line for connecting the first gate line portion and the second gate line portion in the other one row of the at least two rows of pixel circuits and the auxiliary data line,
- wherein each row of pixel circuits further comprises a light emitting control line extending in the row direction, the light emitting control line and the gate line are disposed in the same layer and parallel to each other, the light emitting control line of each row of the m rows of pixel circuits is divided into a first light emitting control line portion and a second light emitting control line portion by the light transmittance region, end portions of the first light emitting control line portion and the second light emitting control line portion close to the light transmittance region are suspended.

* * * * *